United States Patent
Park et al.

(10) Patent No.: US 11,914,242 B2
(45) Date of Patent: Feb. 27, 2024

(54) OPTICAL PATH CONTROL MEMBER AND DISPLAY DEVICE COMPRISING SAME

(71) Applicant: LG INNOTEK CO., LTD., Seoul (KR)

(72) Inventors: Jin Gyeong Park, Seoul (KR); Chan Mi Ju, Seoul (KR); Byung Sook Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/003,577

(22) PCT Filed: Jun. 28, 2021

(86) PCT No.: PCT/KR2021/008056
§ 371 (c)(1),
(2) Date: Dec. 28, 2022

(87) PCT Pub. No.: WO2022/005124
PCT Pub. Date: Jan. 6, 2022

(65) Prior Publication Data
US 2023/0258972 A1    Aug. 17, 2023

(30) Foreign Application Priority Data

Jun. 30, 2020 (KR) .................. 10-2020-0080132

(51) Int. Cl.
*G02F 1/1335* (2006.01)
*G02F 1/1333* (2006.01)
*G02F 1/1343* (2006.01)

(52) U.S. Cl.
CPC .... *G02F 1/133512* (2013.01); *G02F 1/13338* (2013.01); *G02F 1/13439* (2013.01); *G02F 1/134309* (2013.01)

(58) Field of Classification Search
CPC .............. G02F 1/1323; G02F 2202/28; G02F 2001/1678; G02F 1/167; G02F 1/1676; G02B 2207/123
See application file for complete search history.

(56) References Cited

U.S. PATENT DOCUMENTS 7,729,040 B2    6/2010   Uchida
7,876,493 B2    1/2011   Park et al.
(Continued)

FOREIGN PATENT DOCUMENTS

JP    2017-203803 A    11/2017
JP    2019-60946 A     4/2019
(Continued)

OTHER PUBLICATIONS

International Search Report dated Oct. 8, 2021 in International Application No. PCT/KR2021/008056.

*Primary Examiner* — Jia X Pan
(74) *Attorney, Agent, or Firm* — Saliwanchik, Lloyd & Eisenschenk

(57) ABSTRACT

An optical path control member according to an embodiment comprises: a first substrate; a first electrode disposed on the first substrate; a second substrate disposed on the first substrate; a second electrode disposed under the second substrate; and a photoconversion unit disposed between the first electrode and the second electrode, wherein the second substrate includes at least one hole penetrating the second substrate, and an electrode connection part connected to a side surface of the second electrode is disposed inside the hole.

20 Claims, 14 Drawing Sheets

(56) References Cited

U.S. PATENT DOCUMENTS

| | | | |
|---|---|---|---|
| 9,874,799 B2 | 1/2018 | Shiota | |
| 2009/0231676 A1* | 9/2009 | Uchida | G02F 1/1676 |
| | | | 359/296 |
| 2018/0149942 A1* | 5/2018 | Harris | G02F 1/1345 |

FOREIGN PATENT DOCUMENTS

| | | |
|---|---|---|
| KR | 10-2009-0041795 A | 4/2009 |
| KR | 10-1512857 B1 | 4/2015 |
| KR | 10-2019-0060889 A | 6/2019 |
| WO | 2015/122083 A1 | 8/2015 |

* cited by examiner

OPTICAL PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2021/008056, filed Jun. 28, 2021, which claims the benefit under 35 U.S.C. § 119 of Korean Application No. 10-2020-0080132, filed Jun. 30, 2020, the disclosures of each of which are incorporated herein by reference in their entirety.

TECHNICAL FIELD

An embodiment relates to an optical path control member, and to a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be an optical path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting a pattern portion into a light transmitting part and a light blocking part by filling the inside of the pattern portion with particles that may move when a voltage is applied and a dispersion liquid for dispersing the particles and by dispersing and aggregating the particles.

The voltage of the switchable light blocking film forms a connection electrode region connected to an external circuit board at a lower electrode and an upper electrode, and the voltage may be applied to the switchable light blocking film through the connection electrode region.

The connection electrode region is disposed in a region other than the light conversion region, that is, in a bezel region, and a size of the switchable light blocking film is increased by the bezel region, and thus, there is a problem that a display region for displaying a screen is reduced when the switchable light blocking film is applied to a display device.

Accordingly, in order to solve the above problems, an optical path control member having a new structure capable of inhibiting an increase in the bezel region according to the connection electrode region is required.

DISCLOSURE

Technical Problem

An embodiment relates to an optical path control member capable of reducing a size of a bezel region.

Technical Solution

An optical path control member according to an embodiment includes: a first substrate; a first electrode disposed on the first substrate; a second substrate disposed on the first substrate; a second electrode disposed under the second substrate; and a photoconversion unit disposed between the first electrode and the second electrode, wherein the second substrate includes at least one hole penetrating the second substrate and the second electrode, and an electrode connection part connected to a side surface of the second electrode is disposed inside the hole.

Advantageous Effects

An optical path control member according to an embodiment may include an electrode connection part disposed inside a hole formed in a second substrate.

The electrode connection part may be in direct contact with a side surface of a second electrode, and thus, the electrode connection part may be electrically connected to the second electrode.

Accordingly, the electrode connection part exposed through the hole may become a connection electrode of the second electrode and may be connected to an external circuit board.

Accordingly, the second substrate for forming the connection electrode of the second electrode and a partial region of the second electrode may be removed.

That is, in an optical path control member according to a first embodiment, in order to form the connection electrode of the second electrode, it is not necessary to form a protruding region on the second substrate like the first substrate, or a protrusion may be formed only in a partial region of the second substrate, so that a bezel region of a display including the optical path control member may be reduced.

Therefore, when the protrusion is formed only in the partial region of the second substrate, it is possible to form a space capable of disposing other components necessary for the display, for example, components such as a hinge unit, a camera unit, a sensor unit such as an infrared sensor, and a speaker in the case of a notebook computer in a region where the protrusion is not formed, thereby reducing the overall bezel region of the display.

Accordingly, the bezel region of the display including the optical path control member according to the first embodiment may be reduced, thereby reducing the overall size of the display.

In addition, in the optical path control member according to the embodiment, a second connection electrode is formed by forming an open region on the second substrate and disposing the electrode connection part on the protrusion formed by the open region to form the second electrode in order to form the connection electrode of the second electrode, and a first connection electrode is formed in at least a portion of a region corresponding to the open region in the first substrate, and accordingly, protruding regions for forming connection electrodes on the first substrate and the second substrate may be reduced, and through this, a space capable of disposing other components required for the display may be formed in the region where the protrusion is not formed, thereby reducing the overall bezel region of the display.

Accordingly, the display including the optical path control member according to the embodiment may reduce the bezel region of the display, thereby reducing the overall size of the display.

In addition, the optical path control member according to the embodiment additionally forms an auxiliary connection electrode part on at least one protrusion formed in the open region, so that when a main electrode connection part is damaged, it may be connected to a circuit board through the auxiliary connection electrode part, thereby improving the life of optical path control member.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an optical path control member according to an embodiment will be described with reference to drawings. The optical path control member described below relates to a switchable optical path control member driven in various modes according to electrophoretic particles moving by application of a voltage.

First, an optical path control member according to a first embodiment will be described with reference to FIGS. 1 to 8.

Figure 1:
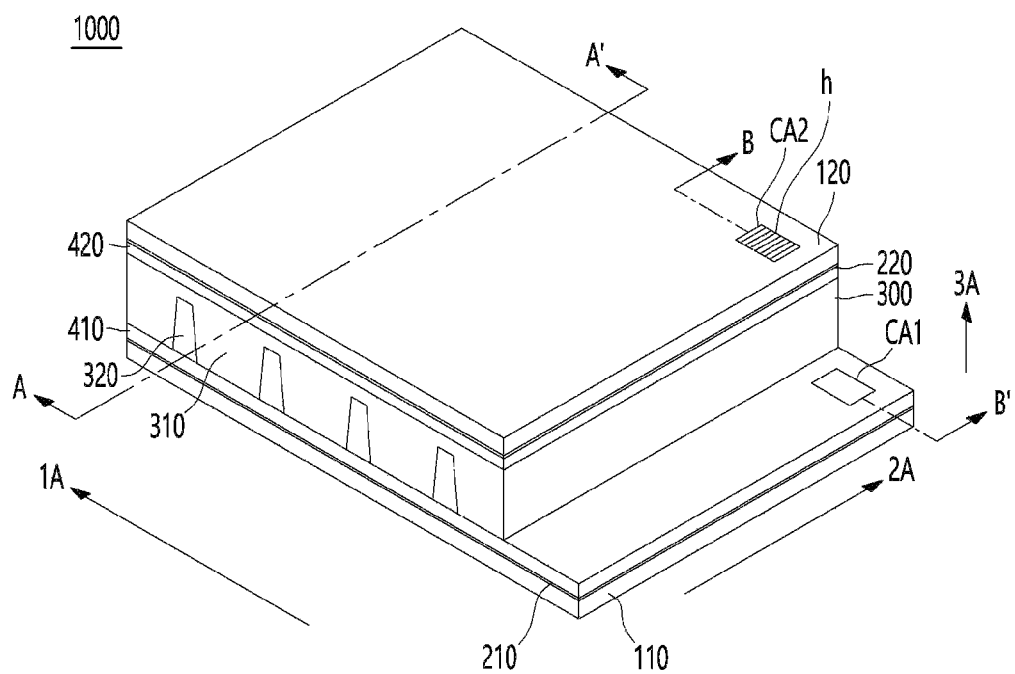
FIG. 1 is a perspective view of an optical path control member according to a first embodiment.
Figure 2:
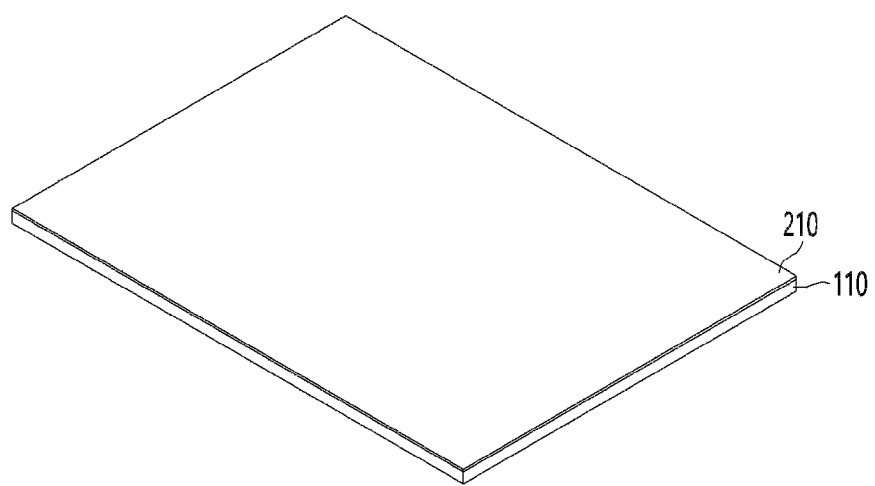
FIGS. 2 and 3 are a perspective view of a first substrate and a first electrode and a perspective view of a second substrate and a second electrode of an optical path control member according to an embodiment.
Figure 3:
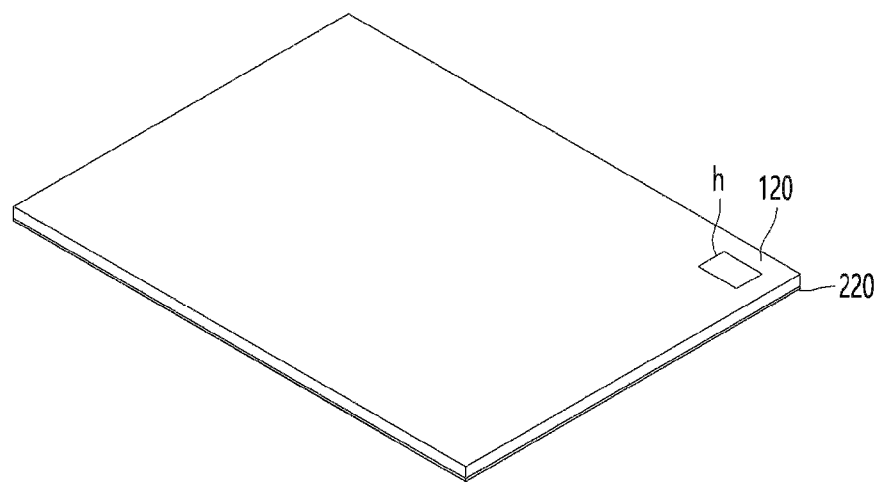

Referring to FIGS. 1 to 3, an optical path control member 1000 according to the first embodiment may include a first substrate 110, a second substrate 120, a first electrode 210, a second electrode 220, and a photoconversion unit 300.

The first substrate 110 may support the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

Further, the first substrate 110 may be a curved or bended substrate. That is, the optical path control member including the first substrate 110 may also be formed to have flexible, curved, or bent characteristics. Accordingly, the optical path control member according to the embodiment may be changed to various designs.

The first substrate 110 may extend in a first direction 1A, a second direction 2A, and a third direction 3A.

In detail, the first substrate 110 may include the first direction 1A corresponding to a length or width direction of the first substrate 110, a second direction 2A extending in a direction different from the first direction 1A and corresponding to the length or width direction of the first substrate 110, and a third direction 3A extending in a direction different from the first direction 1A and the second direction 2A and corresponding to a thickness direction of the first substrate 110.

For example, the first direction 1A may be defined as the length direction of the first substrate 110, the second direction 2A may be defined as the width direction of the first substrate 110 perpendicular to the first direction 1A, and the third direction 3A may be defined as the thickness direction of the first substrate 110. Alternatively, the first direction 1A may be defined as the width direction of the first substrate 110, the second direction 2A may be defined as the length direction of the first substrate 110 perpendicular to the first direction 1A, and the third direction 3A may be defined as the thickness direction of the first substrate 110.

Hereinafter, for convenience of description, the first direction 1A will be described as the length direction of the first substrate 110, the second direction 2A will be described as the width direction of the first substrate 110, and the third directions 3A will be described as the thickness direction of the first substrate 110.

The first electrode 210 may be disposed on one surface of the first substrate 110. In detail, the first electrode 210 may be disposed on an upper surface of the first substrate 110. That is, the first electrode 210 may be disposed between the first substrate 110 and the second substrate 120.

The first electrode 210 may include a transparent conductive material. For example, the first electrode 210 may include a conductive material having a light transmittance of about 80% or more. For example, the first electrode 210 may include a metal oxide such as indium tin oxide, indium zinc oxide, copper oxide, tin oxide, zinc oxide, titanium oxide, etc.

The first electrode 210 may have a thickness of 10 nm to 300 nm.

Alternatively, the first electrode 210 may include various metals to realize low resistance. For example, the first electrode 210 may include at least one metal of chromium (Cr), nickel (Ni), copper (Cu), aluminum (Al), silver (Ag), molybdenum (Mo). Gold (Au), titanium (Ti), and alloys thereof.

Referring to FIG. 2, the first electrode 210 may be disposed on the entire surface of one surface of the first substrate 110. In detail, the first electrode 210 may be disposed as a surface electrode on one surface of the first substrate 110. That is, an area of the first electrode 210 may be the same as that of the first substrate 110. Through this, since the first electrode 210 may be formed on the first substrate 110 and manufactured without patterning the first electrode, a manufacturing process may be efficiently reduced.

However, the embodiment is not limited thereto, and the first electrode 210 may be formed of a plurality of pattern electrodes having a uniform pattern such as a mesh or stripe shape.

For example, the first electrode 210 may include a plurality of conductive patterns. In detail, the first electrode 210 may include a plurality of mesh lines crossing each other and a plurality of mesh openings formed by the mesh lines.

Accordingly, even though the first electrode 210 includes a metal, the first electrode 210 is not visually recognized from the outside, so that visibility may be improved. In addition, the light transmittance is increased by the openings, so that the brightness of the optical path control member according to the embodiment may be improved.

Meanwhile, when the first electrode 210 is formed of metal, a thickness of the first electrode 210 may be formed thick to improve electrical conductivity and reduce resistance. In detail, when the first electrode 210 is formed of metal, the thickness of the first electrode 210 may be 1 um to 5 um. In more detail, the thickness of the first electrode 210 may be 1 um to 4 um. In more detail, the thickness of the first electrode 210 may be 1.5 um to 2.5 um.

The second substrate 120 may be disposed on the first substrate 110. In detail, the second substrate 120 may be disposed on the first electrode 210 on the first substrate 110.

The second substrate 120 may include a material capable of transmitting light. The second substrate 120 may include a transparent material. The second substrate 120 may include a material the same as or similar to that of the first substrate 110 described above.

For example, the second substrate 120 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS). This is only an example, but the embodiment is not limited thereto.

In addition, the second substrate 120 may be a flexible substrate having flexible characteristics.

Further, the second substrate 120 may be a curved or bended substrate. That is, the optical path control member including the second substrate 120 may also be formed to have flexible, curved, or bent characteristics. Accordingly, the optical path control member according to the first embodiment may be changed to various designs.

The second substrate 120 may also extend in the first direction 1A, the second direction 2A, and the third direction 3A in the same manner as the first substrate 110 described above.

In detail, the second substrate 120 may include the first direction 1A corresponding to a length or width direction of the second substrate 120, the second direction 2A extending in a direction different from the first direction 1A and corresponding to the length or width direction of the second substrate 120, and the third direction 3A extending in the direction different from the first direction 1A and the second direction 2A and corresponding to the thickness direction of the second substrate 120.

For example, the first direction 1A may be defined as the length direction of the second substrate 120, the second direction 2A may be defined as the width direction of the second substrate 120 perpendicular to the first direction 1A, and the third direction 3A may be defined as the thickness direction of the second substrate 120.

Alternatively, the first direction 1A may be defined as the width direction of the second substrate 120, the second direction 2A may be defined as the length direction of the second substrate 120 perpendicular to the first direction 1A, and the third direction 3A may be defined as the thickness direction of the second substrate 120.

Hereinafter, for convenience of description, the first direction 1A will be described as the length direction of the second substrate 120, the second direction 2A the second direction 2A will be described as the width direction of the second substrate 120, and the third directions 3A will be described as the thickness direction of the second substrate 120.

A hole h may be formed in the second substrate 120. In detail, at least one hole h may be formed in the second substrate 120.

The holes h1 may pass through the second substrate 120. That is, a depth of the hole may extend in the third direction 3A, and the holes h1 may pass through the second substrate 120.

In addition, the hole h may pass through the second electrode 220 on the second substrate 120.

In addition, the hole h may pass through a buffer layer 420 on the second electrode 220.

In addition, the hole h may pass through a base part of the photoconversion unit 300 on the buffer layer 420.

In addition, the hole h may pass through a portion or entire of a partition wall part 310 of the photoconversion unit 300.

When the hole h is formed to pass through the entire partition wall part 310 of the photoconversion unit 300, the hole h may be formed in one process, thereby effectively reducing the manufacturing process.

A length of the holes h may be smaller than that of the accommodating part 320, and a width of the holes h may be greater than that of the accommodating part 320.

The holes h may be disposed to be spaced apart from both ends in the first direction 1A and both ends in the second direction 2A of the second substrate 120. That is, the holes h may be disposed inside the second substrate 120.

A conductive material may be disposed inside the hole h. That is, an electrode connection part 700 including a conductive material connected to the second electrode 220 may be disposed inside the hole h.

That is, the electrode connection part including the conductive material is disposed inside the hole h, and the electrode connection part may serve as a second connection electrode CA2 of the second substrate 120.

The conductive material disposed inside the hole h will be described in detail below.

The second electrode 220 may be disposed on one surface of the second substrate 120. In detail, the second electrode 220 may be disposed on a lower surface of the second substrate 120. That is, the second electrode 220 may be disposed on one surface of the second substrate 120 in which the second substrate 120 and the first substrate 110 face each other. That is, the second electrode 220 may be disposed to face the first electrode 210 on the first substrate 110. That is, the second electrode 220 may be disposed between the first electrode 210 and the second substrate 120.

The second electrode 220 may include a material the same as or similar to that of the first substrate 110 described above.

The second electrode 220 may include a transparent conductive material. For example, the second electrode 220 may include a conductive material having a light transmittance of about 80% or more. As an example, the second electrode 220 may include a metal oxide such as indium tin oxide, indium zinc oxide, copper oxide, tin oxide, zinc oxide, titanium oxide, etc.

The second electrode 220 may have a thickness of about 10 nm to about 300 nm.

Alternatively, the second electrode 220 may include various metals to realize low resistance. For example, the second electrode 220 may include at least one metal of chromium (Cr), nickel (Ni), copper (Cu), aluminum (Al), silver (Ag), molybdenum (Mo), gold (Au), titanium (Ti), and alloys thereof.

Referring to FIG. 3, the second electrode 220 may be disposed on the entire surface of one surface of the second substrate 120. In detail, the second electrode 220 may be disposed as a surface electrode on one surface of the second substrate 120 excluding a hole region. However, the first embodiment is not limited thereto, and the second electrode 220 may be formed of a plurality of pattern electrodes having a uniform pattern such as a mesh or stripe shape.

For example, the second electrode 220 may include a plurality of conductive patterns. In detail, the second electrode 220 may include a plurality of mesh lines crossing each other and a plurality of mesh openings formed by the mesh lines.

Accordingly, even though the second electrode 220 includes a metal, the second electrode 220 is not visually recognized from the outside, so that visibility may be improved. In addition, the light transmittance is increased by the openings, so that the brightness of the optical path control member according to the first embodiment may be improved.

Meanwhile, when the second electrode 220 is formed of metal, a thickness of the second electrode 220 may be may be formed thick to improve electrical conductivity and reduce resistance. In detail, when the second electrode 220 is formed of metal, the thickness of the second electrode 220 may be 1 μm to 5 μm. In more detail, the thickness of the second electrode 220 may be 1 μm to 4 μm. In more detail, the thickness of the second electrode 220 may be 1.5 μm to 2.5 μm.

The holes h described above may be formed penetrating the second electrode 220. That is, the holes h may pass through the second substrate 120 and the second electrode 220 in the third direction.

The first substrate 110 and the second substrate 120 may correspond to each other or have different sizes.

In detail, a first length extending in the first direction 1A of the first substrate 110 may be different from a second length extending in the first direction 1A of the second substrate 120. For example, the second length of the second substrate 120 extending in the first direction 1A may be smaller than the first length of the first substrate 110 extending in the first direction 1A.

For example, the first length and the second length may have a size of 300 mm to 400 mm.

In addition, a first width extending in the second direction 2A of the first substrate 110 may have a size the same as or similar to a second width extending in the second direction of the second substrate 120.

For example, the first width and the second width may have a size of 150 mm to 200 mm.

In addition, a first thickness extending in the third direction 3A of the first substrate 110 may have a size the same as or similar to a second thickness extending in the third direction of the second substrate 120.

For example, the first thickness and the second thickness may have a size of 1 mm or less.

Referring to FIG. 1, the first substrate 110 and the second substrate 120 may be disposed to have different sizes.

In detail, the second length of the second substrate 120 extending in the first direction 1A may be smaller than the first length of the first substrate 110 extending in the first direction 1A.

Accordingly, the first substrate 110 may be disposed to protrude in one direction of the first direction 1A.

That is, the first substrate 110 may include a protrusion protruding in one direction of the first direction 1A.

Accordingly, the optical path control member 1000 may include a region where the first electrode 210 is exposed on the first substrate 110.

That is, the first electrode 210 disposed on the first substrate 110 may be partially exposed at the protrusion.

The first electrode 210 exposed from the protrusion may serve as a first connection electrode CA1, and a pad part may be disposed on the first connection electrode CA1 to be connected to an external printed circuit board.

For example, the pad part may include a conductive adhesive including at least one of an anisotropic conductive film (ACF) and an anisotropic conductive paste (ACP).

That is, the pad part may be disposed on the first connection electrode CA1 of the first electrode 210, and the pad part and the printed circuit board may be adhered through the conductive adhesive including at least one of the anisotropic conductive film (ACF) and the anisotropic conductive paste (ACP). Alternatively, the first connection electrode CA1 of the first electrode 210 and the printed circuit board may be directly adhered through the conductive adhesive including at least one of the anisotropic conductive film (ACF) and the anisotropic conductive paste (ACP) without an additional pad part.

The photoconversion unit 300 may be disposed between the first substrate 110 and the second substrate 120. In detail, the photoconversion unit 300 may be disposed between the first electrode 210 and the second electrode 220.

An adhesive layer or a buffer layer may be disposed between at least one of between the photoconversion unit 300 and the first substrate 110 or between the photoconversion unit 300 and the second substrate 120, and the first substrate 110, the second substrate 120, and the photoconversion unit 300 may be adhered to each other by the adhesive layer and/or the buffer layer.

For example, an adhesive layer 410 may be disposed between the first electrode 210 and the photoconversion unit 300, thereby adhering the first substrate 110 and the photoconversion unit 300. In detail, the first electrode 210 on the first substrate 110 and the photoconversion unit 300 may be adhered through the adhesive layer 410.

In addition, a buffer layer 420 may be disposed between the second electrode 220 and the photoconversion unit 300, thereby improving adhesion between the second electrode 220 including different materials and the photoconversion unit 300.

The hole described above may be formed to pass through the buffer layer 420 and the photoconversion unit 300. That is, the hole may sequentially pass through the second substrate 120, the second electrode 220, the buffer layer 420, and the photoconversion unit 300 in the third direction.

The photoconversion unit 300 may include a plurality of partition wall parts and accommodating parts. The light conversion material 330 including light conversion particles that move by application of a voltage and a dispersion liquid for dispersing the light conversion particles may be disposed in the accommodating part 320, and light transmission characteristics of the optical path control member may be changed by the light conversion particles.

Figure 4:
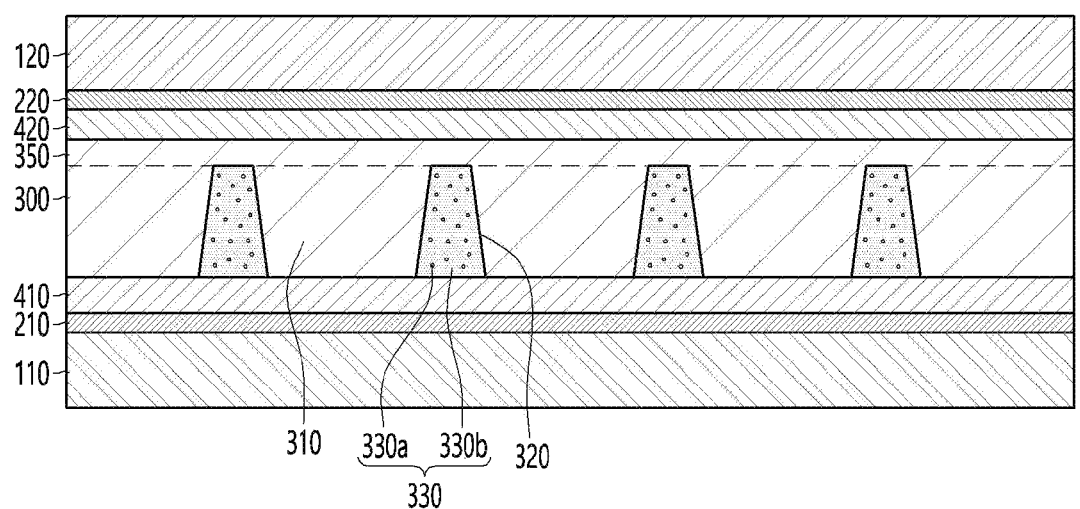
FIGS. 4 and 5 are cross-sectional views taken along line A-A' in FIG. 1.

FIG. 4 is a cross-sectional view taken along line A-A' in FIG. 1.

Figure 5:
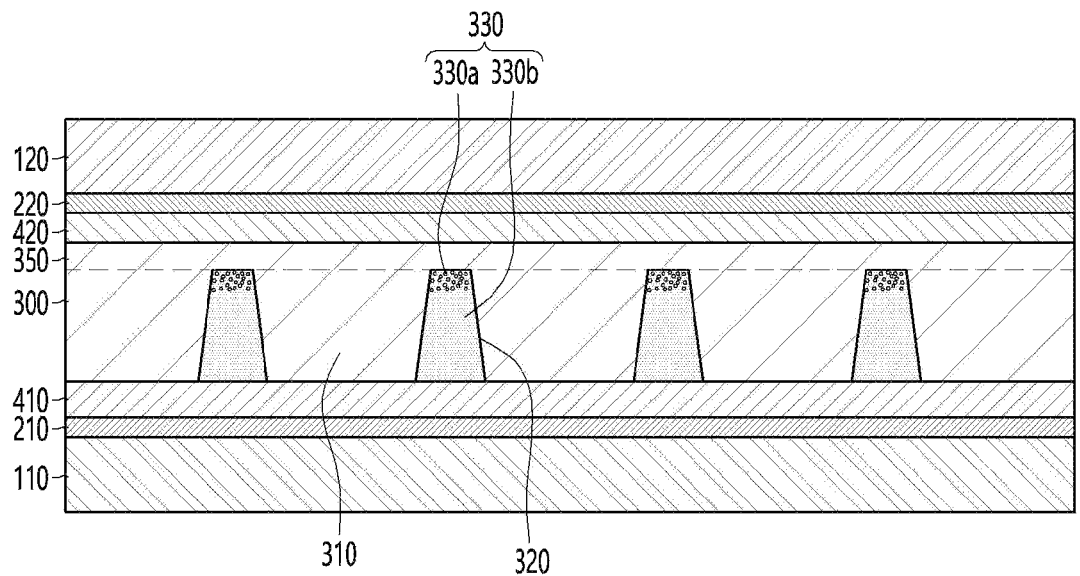

Referring to FIGS. 4 and 5, the photoconversion unit 300 may include a partition wall part 310 and an accommodating part 320.

The partition wall part 310 may be defined as a partition wall part dividing the accommodating part. That is, the partition wall part 310 may transmit light as a barrier region dividing a plurality of accommodating parts. That is, light emitted in the direction of the first substrate 110 or the second substrate 120 may pass through the partition wall part.

The partition wall part 310 and the accommodating part 320 may be disposed to extend in the second direction 2A of the first substrate 110 and the second substrate 120. That is, the partition wall part 310 and the accommodating part 320 may be disposed to extend in the width direction or the length direction of the first substrate 110 and the second substrate 120.

Alternatively, the partition wall part 310 and the accommodating part 320 may extend to have a predetermined inclination angle with respect to the second direction 2A of the first substrate 110 and the second substrate 120. For example, the partition wall part 310 and the accommodating part 320 may extend to have an inclination angle having a range of about 1 degree to about 20 degrees with respect to the second direction 2A of the first substrate 110 and the second substrate 120. That is, the partition wall part 310 and the accommodating part 320 may extend to have an inclination angle having a range of about 1 degree to about 20 degrees with respect to the width direction or the length direction of the first substrate 110 and the second substrate 120. The partition wall part 310 and the accommodating part 320 may be disposed in different widths. For example, a width of the partition wall part 310 may be greater than that of the accommodating part 320.

The partition wall part 310 and the accommodating part 320 may be alternately disposed with each other. In detail, the partition wall part 310 and the accommodating part 320 may be alternately disposed with each other. That is, each of the partition wall parts 310 may be disposed between the accommodating parts 320 adjacent to each other, and each of the accommodating parts 320 may be disposed between the adjacent partition wall parts 310.

The partition wall part 310 may include a transparent material. The partition wall part 310 may include a material that may transmit light.

The partition wall part 310 may include a resin material. For example, the partition wall part 310 may include a photo-curable resin material. As an example, the partition wall part 310 may include a UV resin or a transparent photoresist resin. Alternatively, the partition wall part 310 may include urethane resin or acrylic resin.

The accommodating part 320 may be formed to partially penetrate the photoconversion unit 300. Accordingly, the accommodating part 320 may be disposed in contact with the adhesive layer 410 and may be disposed to be spaced apart from the buffer layer 420. Accordingly, a base part 350 may be formed between the accommodating part 320 and the buffer layer 420.

A light conversion material 330 including light conversion particles 330a and a dispersion liquid 330b in which the light conversion particles 330a are dispersed may be disposed in the accommodating part 320.

The dispersion liquid 330b may be a material for dispersing the light conversion particles 330a. The dispersion liquid 330b may include a transparent material. The dispersion liquid 330b may include a non-polar solvent. In addition, the dispersion liquid 330b may include a material capable of transmitting light. For example, the dispersion liquid 330b may include at least one of a halocarbon-based oil, a paraffin-based oil, and isopropyl alcohol.

The light conversion particles 330a may be disposed to be dispersed in the dispersion liquid 330b. In detail, the plurality of light conversion particles 330a may be disposed to be spaced apart from each other in the dispersion liquid 330b.

The light conversion particles 330a may include a material capable of absorbing light. That is, the light conversion particles 330a may be light absorbing particles. The light conversion particles 330a may have a color. For example, the light conversion particles 330a may have a black-based color. As an example, the light conversion particles 330a may include carbon black.

The light conversion particles 330a may have a polarity by charging a surface thereof. For example, the surface of the light conversion particles 330a may be charged with a negative (−) charge. Accordingly, according to the application of the voltage, the light conversion particles 330a may move toward the first electrode 210 or the second electrode 220.

The light transmittance of the accommodating part 320 may be changed by the light conversion particles 330a. In detail, the accommodating part 320 may be converted into the light blocking part and the light transmitting part by changing the light transmittance due to the movement of the light conversion particles 330a. That is, the accommodating part 320 may change the transmittance of light passing through the accommodating part 320 by dispersion and aggregation of the light conversion particles 330a disposed inside the dispersion liquid 330b.

For example, the optical path control member according to the first embodiment may be switched from a first mode to a second mode or from the second mode to the first mode by a voltage applied to the first electrode 210 and the second electrode 220.

In detail, in the optical path control member according to the first embodiment, the accommodating part 320 becomes the light blocking part in the first mode, and light of a specific angle may be blocked by the accommodating part 320. That is, a viewing angle of the user viewing from the outside is narrowed, so that the optical path control member may be driven in a privacy mode.

In addition, in the optical path control member according to the first embodiment, the accommodating part 320 becomes the light transmitting part in the second mode, and in the optical path control member according to the first embodiment, light may be transmitted through both the partition wall part 310 and the accommodating part 320. That is, the viewing angle of the user viewing from the outside may be widened, so that the optical path control member may be driven in a public mode.

The switching from the first mode to the second mode, that is, the conversion of the accommodating part 320 from the light blocking part to the light transmitting part may be implemented by the movement of the light conversion particles 330a of the accommodating part 320. That is, the light conversion particles 330a may have a charge on the surface thereof and may move toward the first electrode or the second electrode according to the application of a voltage according to characteristics of the charge. That is, the light conversion particles 330a may be electrophoretic particles.

For example, when a voltage is not applied to the optical path control member from the outside, the light conversion particles 330a of the accommodating part 320 are uniformly dispersed in the dispersion liquid 330b, and the accommodating part 320 may block light by the light conversion particles. Accordingly, in the first mode, the accommodating part 320 may be driven as the light blocking part.

In addition, when a voltage is applied to the optical path control member from the outside, the light conversion particles 330a may move. For example, the light conversion particles 330a may move toward one end or the other end of the accommodating part 320 by a voltage transmitted through the first electrode 210 and the second electrode 220. That is, the light conversion particles 330a may move from the accommodating part 320 toward the first electrode 210 or the second electrode 220.

For example, when a voltage is applied to the first electrode 210 and/or the second electrode 220, an electric field is formed between the first electrode 210 and the second electrode 220, and the light conversion particles 330a charged with the negative charge may move toward a positive electrode of the first electrode 210 and the second electrode 220 using the dispersion liquid 330b as a medium.

As an example, in the initial mode or when the voltage is not applied to the first electrode 210 and/or the second electrode 220, as shown in FIG. 4, the light conversion particles 330a may be uniformly dispersed in the dispersion liquid 330b, and the accommodating part 320 may be driven as the light blocking part.

In addition, when the voltage is applied to the first electrode 210 and/or the second electrode 220, as shown in FIG. 5, the light conversion particles 330a may move toward the second electrode 220 in the dispersion liquid 330b. That is, the light conversion particles 330a move in one direction, and the accommodating part 320 may be driven as the light transmitting part.

Accordingly, the optical path control member according to the first embodiment may be driven in two modes according to a user's surrounding environment. That is, when the user requires light transmission only at a specific viewing angle, the accommodating part is driven as the light blocking part, or in an environment in which the user requires high brightness, a voltage may be applied to drive the accommodating part as the light transmitting part.

Therefore, since the optical path control member according to the first embodiment may be implemented in two modes according to the user's requirement, the optical path control member may be applied regardless of the user's environment.

Figure 6:
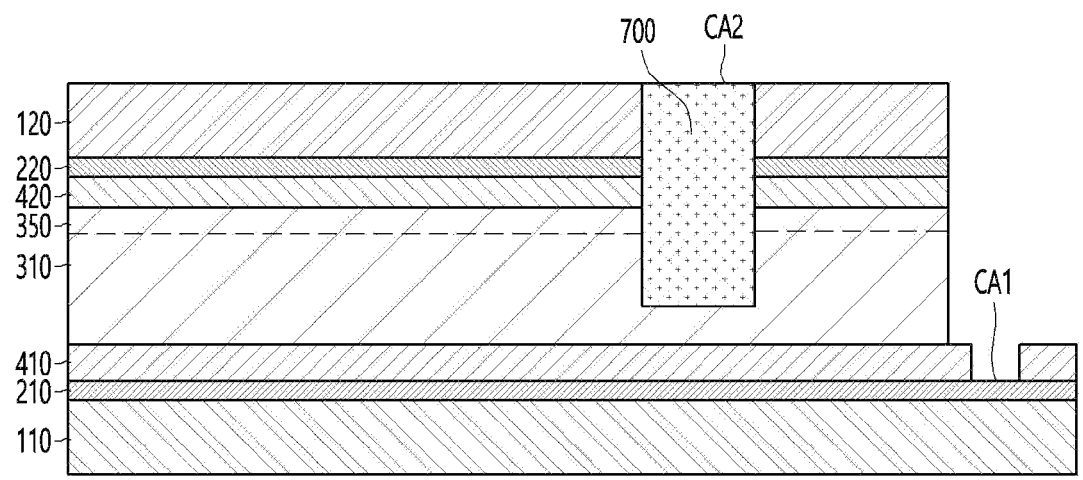
FIGS. 6 to 8 are cross-sectional views taken along line B-B' in FIG. 1.
Figure 7:
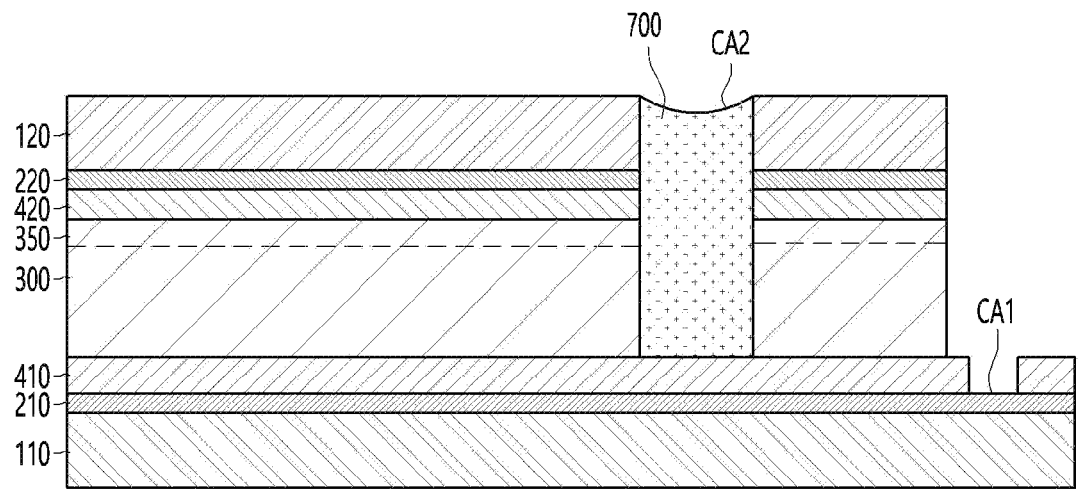
Figure 8:
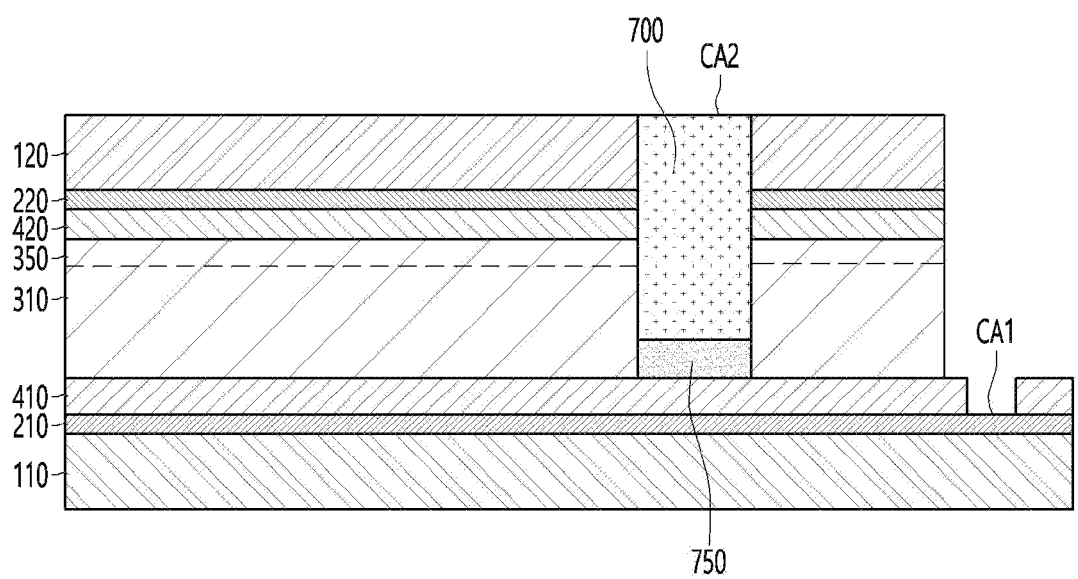

FIGS. 6 to 8 are cross-sectional views taken along line B-B' in FIG. 1. That is, FIGS. 6 to 8 are cross-sectional views taken along one end and the other end of a hole formed in the second substrate 120.

Referring to FIGS. 6 to 8, the hole h may be formed to pass through the second substrate 120, the second electrode 220, the buffer layer 420, and the photoconversion unit 300. That is, the hole h may pass through the second substrate 120, the second electrode 220, and the buffer layer 420 and may be formed by removing the base part 350 and the partition wall part 310 of the photoconversion unit 300.

For example, referring to FIG. 6, the hole h may pass through the second substrate 120, the second electrode 220, the buffer layer 420, and the base part 350 and may be formed to partially pass through the partition wall part 310.

In addition, referring to FIGS. 7 and 8, the hole h may be formed to pass through all of the second substrate 120, the second electrode 220, the buffer layer 420, the base part 350, and the partition wall part 310.

Accordingly, the adhesive layer 410 may be exposed through the hole h. That is, in the case of FIGS. 7 and 8, the adhesive layer 410 may be exposed through a bottom surface of the hole h.

An electrode connection part 700 formed of a conductive material may be disposed inside the hole formed in the second substrate 220.

The electrode connection part 700 may include a material different from that of at least one of the first electrode 210 and the second electrode 220. In addition, the light transmittance of the electrode connection part 700 may be smaller than that of at least one of the first electrode 210 and the second electrode 220.

For example, the electrode connection part 700 may include metal. In detail, the electrode connection part 700 may include a metal paste in which metal particles are dispersed in a binder.

The electrode connection part 700 may be disposed in contact with a side surface of the second substrate 120. In addition, the electrode connection part 700 may be disposed in contact with a side surface of the second electrode 220. In addition, the electrode connection part 700 may be disposed in contact with a side surface of the buffer layer 420. In addition, the electrode connection part 700 may be disposed in contact with a side surface of the base part 350. In addition, the electrode connection part 700 may be disposed in contact with a side surface of the partition wall part 310.

That is, the electrode connection part 700 may be disposed in contact with at least one of side surfaces of the second substrate 120, the second electrode 220, the buffer layer 420, the base part 350, and the partition wall part 310. In addition, referring to FIG. 7, the electrode connection part 700 may be disposed in direct contact with the adhesive layer 410.

Alternatively, referring to FIGS. 6 and 8, the electrode connection part 700 may be disposed to be spaced apart from the adhesive layer 410. In detail, the partition wall part 310 may be disposed between the electrode connection part 700 and the adhesive layer 410 as shown in FIG. 6 or an insulating layer 750 is disposed as shown in FIG. 8, and accordingly, the electrode connection part 700 may be disposed to be spaced apart from the adhesive layer 410.

When the electrode connection part 700 and the adhesive layer 410 are disposed to be spaced apart from each other, electrical connection between the electrode connection part 700 and the first electrode 210 may be inhibited due to the permittivity of the adhesive layer 410, and thus restrictions in selecting a material for the adhesive layer 410 may be reduced, and an electrical short according to the permittivity of the adhesive layer 410 may be inhibited.

An upper surface of the electrode connection part 700 may be disposed on the same plane as or lower than an upper surface of the second substrate 120. For example, as shown in FIGS. 6 and 8, the upper surface of the electrode connection part 700 and the upper surface of the second substrate 120 may be disposed on the same plane, or, as shown in FIG. 7, the upper surface of the electrode connection part 700 may be disposed lower than the upper surface of the second substrate 120.

Accordingly, the upper surface of the electrode connection part 700 and the upper surface of the second substrate 120 may be formed on the same plane without a step, or the upper surface of the electrode connection part 700 may be disposed with a step such that the upper surface thereof is low.

Accordingly, it is possible to reduce the overall thickness of the optical path control member by inhibiting the overall thickness of the optical path control member from being increased due to the height of the electrode connection part 700.

The electrode connection part 700 may be electrically connected to the second electrode 220 and exposed to the outside of the second substrate 120. Accordingly, the electrode connection part 700 may serve as a second connection electrode CA2 of the second electrode 220 connected to an external circuit board.

That is, the upper surface of the electrode connection part 700 exposed to the upper surface of the second substrate 120 may become the second connection electrode CA2 of the second electrode 220, and a pad part and/or a conductive adhesive may be disposed on the second connection electrode CA2 to be connected to the external circuit board.

In addition, the pad part and/or the conductive adhesive are disposed on the first connection electrode CA1 of the first electrode exposed by removing the adhesive layer 410 from the upper surface of the first substrate 110 and may be connected to the same external circuit board.

Accordingly, the first electrode 210 and the second electrode 220 may be connected to the same circuit board to be electrically connected to each other.

However, the embodiment is not limited thereto, and the circuit board may be separately divided to be electrically connected to the first electrode and the second electrode. That is, the first electrode 210 may be connected to a first circuit board, and the second electrode may be connected to a second circuit board different from the first circuit board.

The optical path control member according to the first embodiment may include the electrode connection part disposed inside the hole formed in the second substrate.

The electrode connection part may be in direct contact with the side surface of the second electrode, and thus, the electrode connection part may be electrically connected to the second electrode.

Accordingly, the electrode connection part exposed on the upper surface of the second substrate may become the second connection electrode of the second electrode and may be connected to the external circuit board.

Accordingly, a region of the second substrate for forming the second connection electrode of the second electrode may be removed.

That is, in the optical path control member according to the first embodiment, in order to form the connection electrode of the second electrode, it is not necessary to form a protruding region on the second substrate like the first substrate, so that a bezel region of a display including the optical path control member may be reduced.

Accordingly, in the overall size of the optical path control member according to the first embodiment, the overall size may be reduced by reducing the bezel region.

Hereinafter, an optical path control member according to a second embodiment will be described with reference to FIGS. 9 to 12. In the description of the optical path control member according to the second embodiment, descriptions of the same as or similar to those of the optical path control member according to the first embodiment described above will be omitted and the same reference numerals are assigned to the same configurations.

Figure 9:
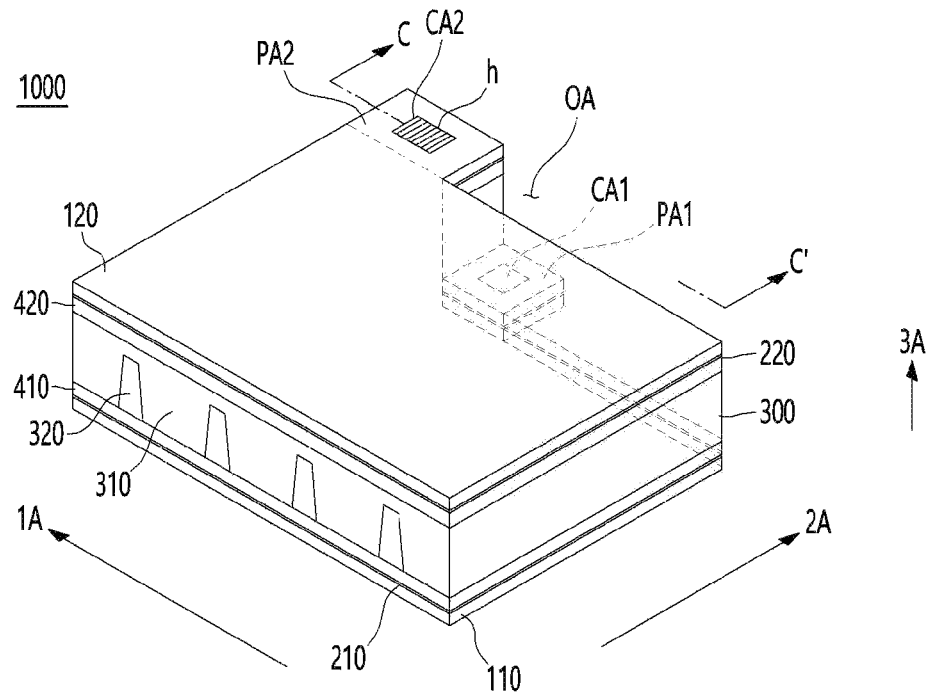
FIGS. 9 and 10 are perspective views of an optical path control member according to a second embodiment.
Figure 10:
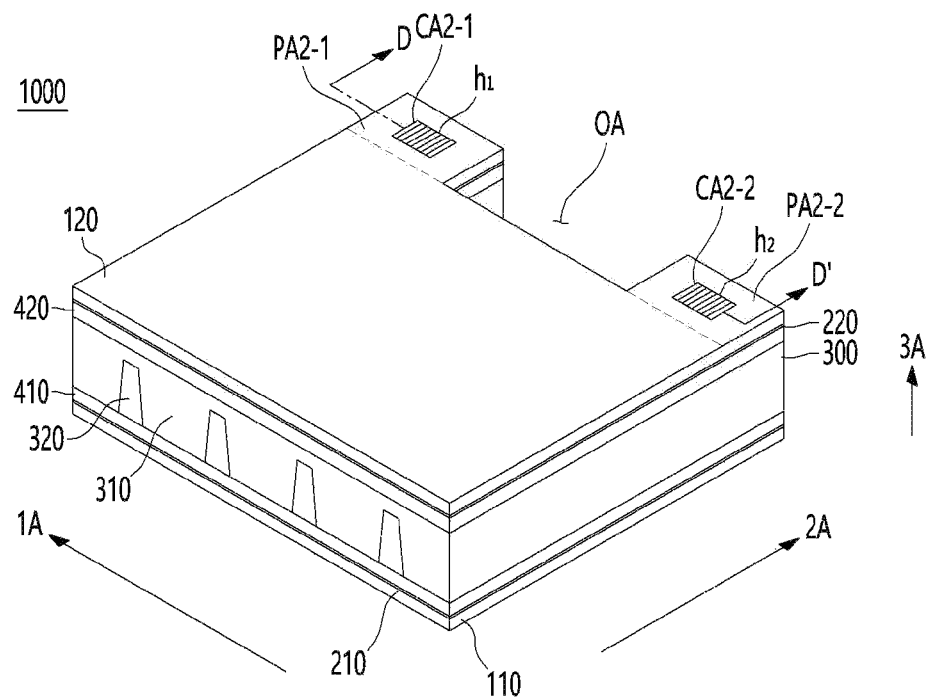

Referring to FIGS. 9 and 10, the first substrate 110 and the second substrate 120 may have different sizes.

In detail, the second substrate 120 may include an open region OA where the second substrate 120 is open. In addition, the first substrate 110 may be disposed on a portion (FIG. 9) or entire (FIG. 10) of the open region OA. That is, sizes of the first substrate 110 and the second substrate 120 may differ by a size of the first substrate 110 disposed in the open region OA.

The second substrate 120 may have a protrusion protruding in the second direction 2A by the open region OA.

Referring to FIGS. 9 and 10, at least one hole may be formed in the second substrate 120. In detail, referring to FIG. 9, one or a plurality of holes h may be formed in the second substrate 120. In detail, one hole h may be formed in the second protrusion PA2 of the second substrate 120. In addition, the first connection electrode CA1 may be exposed from the first protrusion PA1 of the first substrate 110.

In addition, referring to FIG. 10, a plurality of holes may be formed in the second substrate 120. In detail, a first hole h1 and a second hole h2 may be formed in protrusions PA2-1 and PA2-2 of the second substrate 120, respectively.

The first hole h1 and the second hole h2 may be spaced apart from each other by the open region OA.

Figure 11:
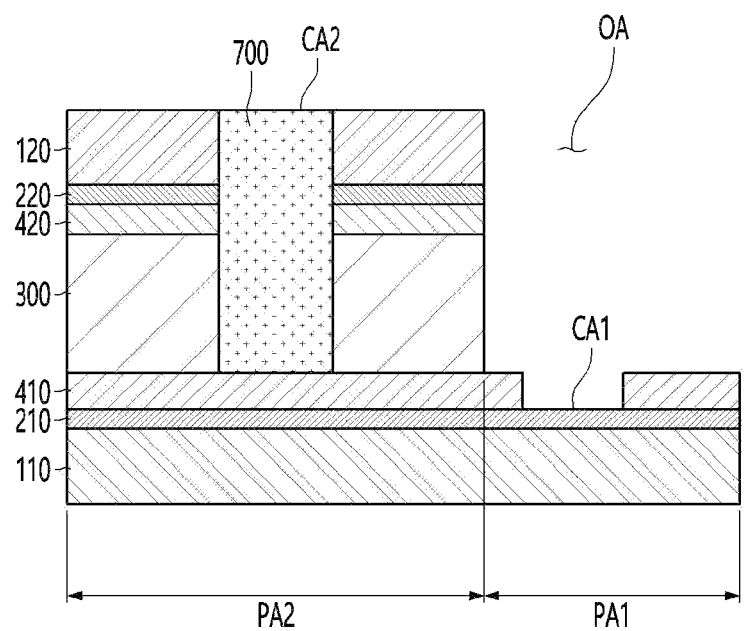
FIG. 11 is a cross-sectional view taken along line C-C' in FIG. 9.

FIG. 11 is a cross-sectional view taken along line C-C' in FIG. 9. Referring to FIG. 11, the hole h may be formed to pass through the second substrate 120, the second electrode 220, the buffer layer 420, the base part 350, and the partition wall part 310.

An electrode connection part 700 formed of a conductive material may be disposed inside the hole h formed in the second substrate 220.

The electrode connection part 700 may include a material different from that of at least one of the first electrode 210 and the second electrode 220. In addition, the light transmittance of the electrode connection part 700 may be smaller than that of at least one of the first electrode 210 and the second electrode 220.

For example, the electrode connection part 700 may include metal. In detail, the electrode connection part 700 may include a metal paste in which metal particles are dispersed in a binder.

The electrode connection part 700 may be in direct contact with the side surface of the second electrode 220. Accordingly, the electrode connection part 700 may be electrically connected to the second electrode 220 and exposed to the outside of the second substrate 120. Accordingly, the electrode connection part 700 may serve as a second connection electrode CA2 of the second electrode 220 connected to an external circuit board.

Since the electrode connection part 700 is disposed in contact with the side surface of the second electrode 220, the optical path control member and a bezel region of a display device including the same may be reduced, thereby providing a wider display region for the user.

That is, a region where the first electrode 210 and the second electrode 220 are connected to the external printed circuit board may be disposed in a bezel v where no display is displayed in the optical path control member. In this case, in order to connect the printed circuit board with the first electrode 210 and the second electrode 220, an additional bezel region such as the protrusion described above is required, and thus there is a problem that the bezel region is increased. The optical path control member according to the examples may reduce a size of the bezel region such as the protrusion. That is, the protrusion on which the first electrode 210 and the second electrode 220 connected to the printed circuit board are disposed is not formed by entirely extending a surface of the first direction 1A or a surface of the second direction 2A of the first substrate 110 and the second substrate 120 but is not formed by partially the surface of the first direction 1A or the surface of the second direction 2A of the first substrate 110 and the second substrate 120, and thus the entire bezel region may be reduced.

That is, the upper surface of the electrode connection part 700 may become an upper surface of the second connection electrode CA2 of the second electrode 220, and a pad part and/or a conductive adhesive may be disposed on the second connection electrode CA2 to be connected to the external circuit board.

In addition, a first connection electrode CA1 of the first electrode exposed by removing the adhesive layer 410 may be formed on the upper surface of the first substrate 110. The first connection electrode CA1 may be disposed on a region corresponding to the open region OA of the second substrate 120. That is, the first connection electrode CA1 may vertically overlap the open region OA.

The pad part may also be disposed on the first connection electrode CA1 and may be connected to the same external circuit board to which the second connection electrode is connected.

For example, the pad part may include a conductive adhesive including at least one of an anisotropic conductive film (ACF) and an anisotropic conductive paste (ACP).

That is, the pad part may be disposed on the first electrode 210 and the second electrode 220, and the pad part and the printed circuit board may be adhered through the conductive adhesive including at least one of the anisotropic conductive film (ACF) and the anisotropic conductive paste (ACP), or, the first electrode 210 and the second electrode 220 may be adhered to the printed circuit board through the conductive adhesive including at least one of the anisotropic conductive film (ACF) and the anisotropic conductive paste (ACP) without an additional pad part.

Figure 12:
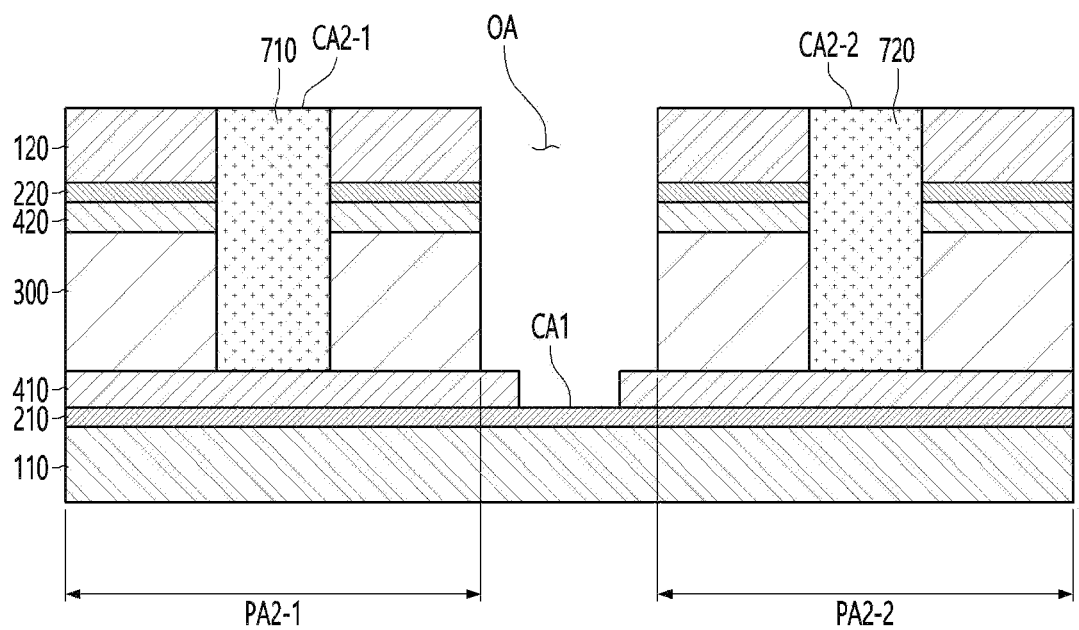
FIG. 12 is a cross-sectional view taken along line D-D' in FIG. 10.

FIG. 12 is a cross-sectional view taken along line D-D' in FIG. 10. Referring to FIG. 12, the first hole h1 and the second hole h2 may be formed pass through the second substrate 120, the second electrode 220, the buffer layer 420, and the base part 350 and may be formed to partially pass through the partition wall part.

Depths of the first hole h1 and the second hole h2 may be the same or different. In detail, the first hole h1 and the second hole h2 may be formed to the same depth as shown in FIG. 12 or may be not limited thereto, and the first hole h1 and the second hole h2 may be formed to have different depths.

The electrode connection part 700 formed of the conductive material may be disposed inside the first hole h1 and the second hole h2 formed in the second substrate 220, respectively. That is, the first electrode connection part 710 may be disposed in the first hole h1, and the second electrode connection part 720 may be disposed in the second hole h2.

At least one of the first electrode connection part 710 and the second electrode connection part 720 may include a material different from that of at least one of the first electrode 210 and the second electrode 220. In addition, the light transmittance of at least one of the first electrode connection part 710 and the second electrode connection part 720 may be smaller than that of at least one of the first electrode 210 and the second electrode 220.

For example, at least one of the first electrode connection part 710 and the second electrode connection part 720 may include metal. In detail, at least one of the first electrode connection part 710 and the second electrode connection part 720 may include a metal paste in which metal particles are dispersed in a binder.

At least one of the first electrode connection part 710 and the second electrode connection part 720 may be in direct contact with the side surface of the second electrode 220. Accordingly, at least one of the first electrode connection part 710 and the second electrode connection part 720 may be electrically connected to the second electrode 220 and exposed to the outside of the second substrate 120. Accordingly, at least one of the first electrode connection part 710 and the second electrode connection part 720 may serve as second connection electrodes CA2-1 and CA2-2 of the second electrode 220 connected to the external circuit board. That is, the first electrode connection part 710 may become the second connection electrode CA2-1 of the second electrode and/or the second electrode connection part 720 may become the second connection electrode CA2-2 of the second electrode.

That is, a plurality of electrode connection parts may be disposed on the second substrate 120 and a plurality of connection electrodes may be formed on the second substrate 120. For example, the second substrate 120 may include both the first electrode connection part and the second electrode connection part disposed in each hole.

That is, an upper surface of the first electrode connection part 710 exposed to the upper surface of the second substrate 120 may become the second connection electrode CA2-1 of the second electrode 220, and an upper surface of the second electrode connection part 720 may become the second connection electrode CA2-2 of the second electrode 220, and a pad part and/or a conductive adhesive may be disposed on the second connection electrodes CA2-1 and CA2-2 to be connected to the external circuit board.

The optical path control member according to the second embodiment shown in FIGS. 10 and 12 may form two electrode connection parts serving as the second connection electrode. Accordingly, one electrode connection part is used as a main connection electrode and the other electrode connection part is used as an auxiliary connection electrode, so that even though a contact failure with the second electrode occurs in a main electrode connection part, it is possible to connect to the circuit board through an auxiliary electrode connection part.

In addition, the first connection electrode CA1 of the first electrode exposed by removing the adhesive layer 410 may be formed on the upper surface of the first substrate 110. The first connection electrode CA1 may be disposed on a region corresponding to the open region OA of the second substrate 120. That is, the first connection electrode CA1 may vertically overlap the open region OA.

The pad part and/or the conductive adhesive may also be disposed on the first connection electrode CA1 and may be connected to the same external circuit board.

The optical path control member according to the second embodiment may include the electrode connection part disposed inside the hole formed in the second substrate.

The electrode connection part may be in direct contact with the side surface of the second electrode, and thus, the electrode connection part may be electrically connected to the second electrode.

Accordingly, the electrode connection part exposed on the upper surface of the second substrate may become the second connection electrode of the second electrode and may be connected to the external circuit board.

Accordingly, the region of the second substrate for forming the second connection electrode of the second electrode may be reduced.

That is, in the optical path control member according to the second embodiment, in order to form the connection electrode of the second electrode, the second connection electrode may be formed by forming the open region in the second substrate and disposing the connection electrode on the protrusion formed by the open region of the second electrode, and the first connection electrode may be formed in a region corresponding to the open region in the first substrate. Accordingly, in the second substrate, since only a size of a hole formation region is required to form the second connection electrode connected to the printed circuit board, it is not necessary to entirely expand the surface of the first direction 1A or the surface of the second direction 2A of the second substrate 120. In addition, since the first connection electrode is disposed only in the open region of the first substrate, a size of a protruding region of the first substrate for disposing the first connection electrode may be reduced. Therefore, the entire bezel region of the display including the optical path control member according to the embodiment may be reduced.

Since there is no need to form protruding regions for forming connection electrodes on the first substrate and the second substrate, the bezel region of the optical path control member may be reduced.

Accordingly, the overall size of the optical path control member according to the second embodiment may be reduced by reducing the bezel region.

In addition, the optical path control member according to the second embodiment additionally forms an auxiliary connection electrode part on a plurality of protrusions formed in the open region, so that when the main electrode connection part is damaged, it may be connected to the circuit board through the auxiliary connection electrode part, thereby improving the life of optical path control member.

Hereinafter, the optical path control member according to a third embodiment will be described with reference to FIGS. 13 to 18. In the description of the optical path control member according to the third embodiment, descriptions of the same as or similar to those of the optical path control member according to the first and second embodiments described above will be omitted and the same reference numerals are assigned to the same configurations.

Figure 13:
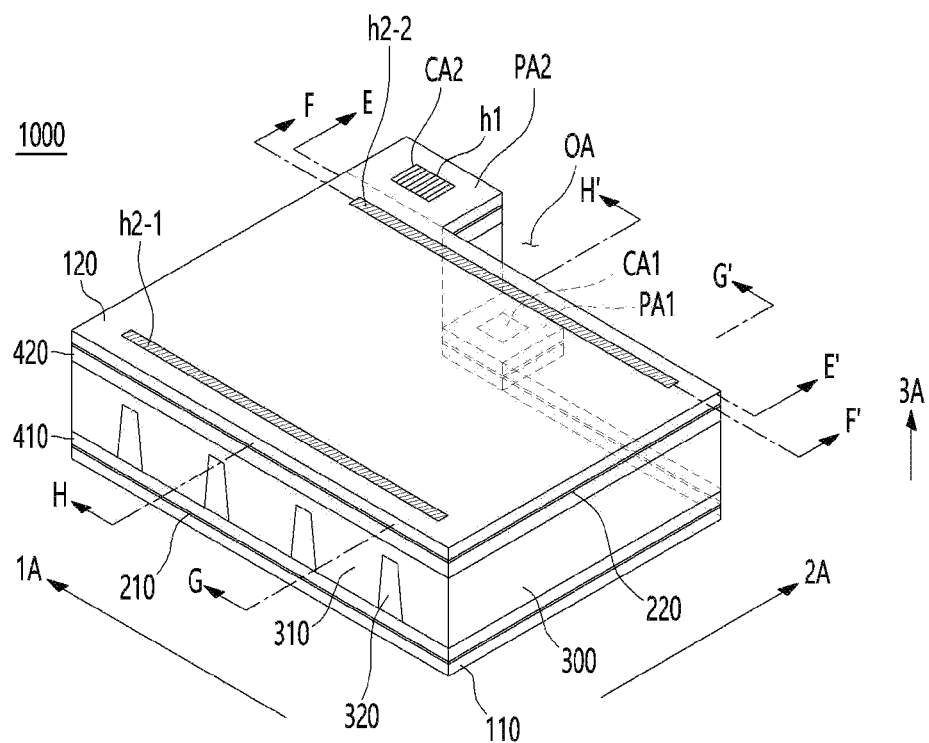
FIG. 13 is a perspective view of an optical path control member according to a third embodiment.

Referring to FIG. 13, the first substrate 110 and the second substrate 120 may have different sizes.

In detail, the second substrate 120 may include an open region OA where the second substrate 120 is open. In addition, the first substrate 110 may be disposed in a part of the open region OA. That is, the sizes of the first substrate 110 and the second substrate 120 may differ by the size of the first substrate 110 disposed in the open region OA.

The second substrate 120 may have a protruding portion PA2 protruding in the second direction 2A by the open region OA. In addition, the first connection electrode CA1 may be exposed from the first protrusion PA1 of the first substrate 110.

A plurality of holes may be formed in the second substrate 120. In detail, the second substrate 120 may include the first hole h1 formed in a protruding region of the second substrate 120 and the second holes h2-1 and h2-2 formed in regions other than the protruding region.

An electrode connection unit 700 may be disposed in the first hole h1 like the optical path control member according to the second embodiment described above.

Hereinafter, with reference to FIGS. 14 to 18, the configuration of the first hole h1 and the second holes h2-1 and h2-2 and the light conversion material 330 disposed in the accommodating part 320, the sealing part 500 and the dam part 600 will be described in detail.

Figure 14:
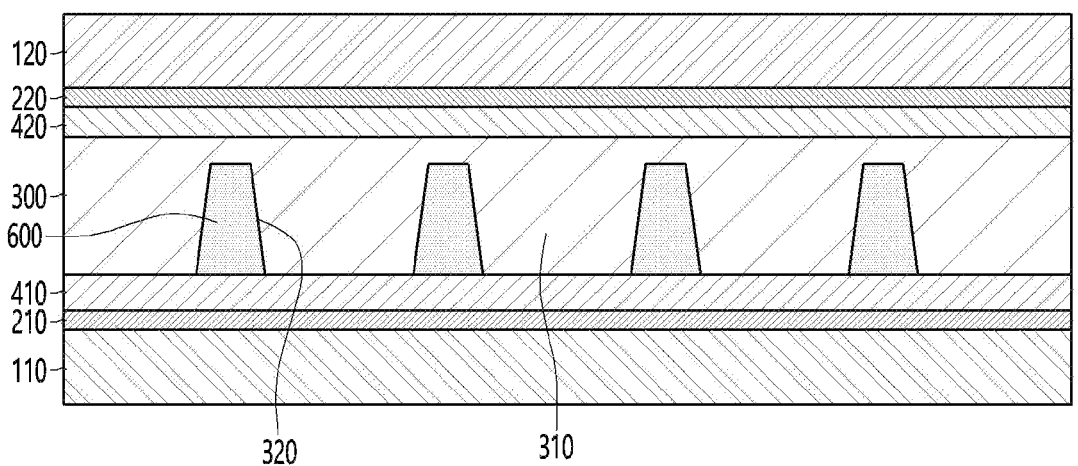
FIG. 14 is a cross-sectional view taken along line E-E' in FIG. 13.

FIG. 14 is a cross-sectional view taken along line E-E' in FIG. 13. That is, FIG. 14 is a cross-sectional view taken between the second holes h2-1 and h2-2 formed in the second substrate 120 and one end or the other end in the second direction 2A of the second substrate 120.

Referring to FIG. 14, a resin material may be filled in the accommodating part 320 and the dam part 600 may be disposed therein. That is, the dam part 600 may be disposed in the accommodating part 320 between the second hole h2-1 formed in the second substrate 120 and one end of the second substrate 120 in the second direction 2A and between the second hole h2-2 formed in the second substrate 120 and the other end of the second substrate 120 A in the second direction 2A. That is, the dam part 600 may be disposed the outer region of the second holes h2-1 and h2-2.

However, the embodiment is not limited thereto, and at least one of the second holes h2-1 and h2-2 may be formed, or a plurality of second holes h2-1 and a plurality of second holes h2-2 may be formed, or a plurality of second holes h2-1 and one second hole h2-2 may be formed.

The dam part 600 may be disposed while completely or partially filling the inside of the accommodating part 320. For example, the dam part 600 may be disposed while partially filling the inside of the accommodating part 320. Accordingly, the adhesive layer 410 may be disposed while partially filling the inside of the accommodating part 320. That is, only the dam part 600 may be disposed in the accommodating part 320 or the dam part 600 and the adhesive layer 410 may be disposed together.

When the light conversion material 330 including a dispersion in which light conversion particles are dispersed is filled in the accommodating part 320, the dam part 600 may inhibit the light conversion material from moving in a direction between the hole formed in the second substrate 120 and one end of the second direction 2A of the second substrate 120. Accordingly, the light conversion material 330 may be injected only into a region between the holes by the dam part.

Figure 15:
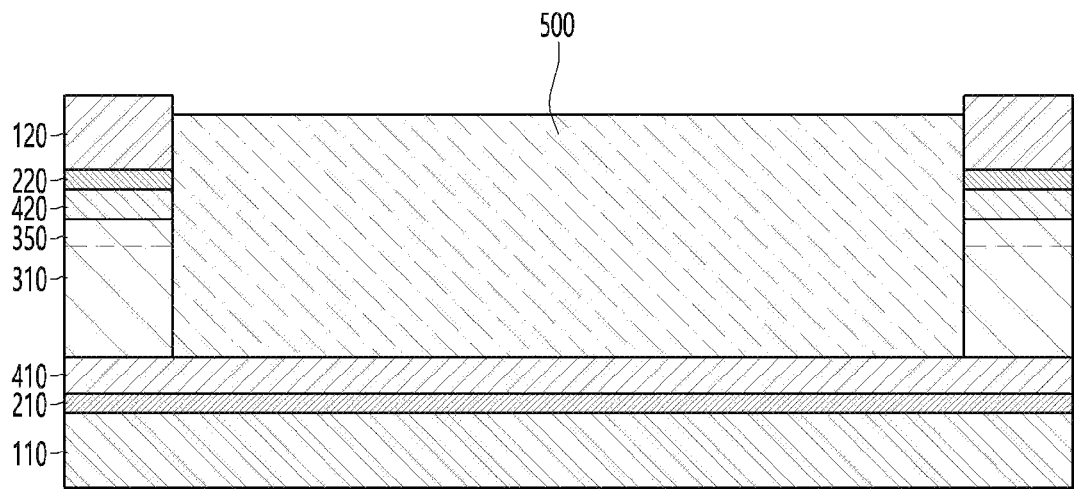
FIG. 15 is a cross-sectional view taken along line F-F' in FIG. 13.

FIG. 15 is a cross-sectional view taken along line F-F' in FIG. 13. That is, FIG. 15 is a cross-sectional view taken one end and the other end of the second holes h2-1 and h2-2 formed in the second substrate 120.

Referring to FIG. 15, the second holes h2-1 and h2-2 may be formed to pass through the second substrate 120, the second electrode 220, the buffer layer 420, and the photoconversion unit 300. That is, the second holes h2-1 and h2-2 may pass through the second substrate 120, the second electrode 220, and the buffer layer 420 and may be formed by removing both the base part 350 and the partition wall part 310 of the photoconversion unit 300.

Accordingly, the adhesive layer 410 may be exposed through the second holes h2-1 and h2-2. That is, the adhesive layer 410 may be exposed through the bottom surfaces of the second holes h2-1 and h2-2.

The sealing part 500 formed of a sealing material may be disposed inside the second holes h2-1 and h2-2 formed in the second substrate 220. That is, the sealing part 500 including a sealing material such as epoxy may be disposed inside the second holes h2-1 and h2-2 formed through the second substrate 120, the second electrode 220, the buffer layer 420, and the photoconversion unit 300. For example, the sealing material may include a material different from a material forming the partition wall part 310 and the base part 350. As an example, the sealing material may include the epoxy.

Accordingly, the sealing part 500 may be disposed in contact with the side surface of the second substrate 120. In addition, the sealing part 500 may be disposed in contact with a side surface of the second electrode 220. In addition, the sealing part 500 may be disposed in contact with a side surface of the buffer layer 420. In addition, the sealing part 500 may be disposed in contact with a side surface of the base part 350. In addition, the sealing part 500 may be disposed in contact with a side surface of the partition wall part 310. In addition, the sealing part 500 may be disposed in direct contact with the adhesive layer 410.

A thickness T of the sealing part 500 may be equal to or smaller than a sum of those of the partition wall part 310, the base part 350, the buffer layer 420, the second electrode 220, and the second substrate 120.

That is, an upper surface of the sealing part 500 may be disposed on the same plane as an upper surface of the second substrate 120 or may be lower. Accordingly, the upper surface of the sealing part 500 may be formed without a step on the same plane as the upper surface of the second substrate 120, or the upper surface of the sealing part 500 may be disposed with a step such that the upper surface thereof is low.

Accordingly, it is possible to reduce the overall thickness of the optical path control member by inhibiting the overall thickness of the optical path control member from being increased due to a height of the sealing part 500.

The sealing part 500 may serve to seal the light conversion material filled in the accommodating part 320 between the second holes h2-1 and h2-2. That is, after supplying the light conversion material to the second hole h2-1, the light conversion material may move in a direction of the second hole h2-2 from the second hole h2-1 through a capillary method to be injected into the accommodating part 320 between the second hole h2-1 and the second hole h2-2.

Then, in order to seal both ends of the light conversion material injected into the accommodating part 320, the sealing material may be filled into the holes to form the sealing part 500, and the light conversion material injected into the accommodating part 320 may be sealed by filling the second hole h2-1 and the second hole h2-2.

The holes defined as the injection part of the light conversion material are formed by removing all of the partition wall parts, and thus a moving path of the light conversion material in the injection part may be increased, and accordingly, an injection speed of the light conversion material may be improved.

In addition, since all of the partition wall parts are removed from the holes, when the sealing material is disposed inside the holes after injecting the light conversion material, an area where the sealing material is disposed may be increased, thereby improving the sealing properties of the light conversion material.

In addition, the embodiment is not limited thereto, and in order to minimize the bezel region of the optical path control member, in at least one of the second holes h2-1 and h2-2, a part of the hole may become the outermost surface of the optical path control member by removing a portion or entire of at least one outer surface of the hole and the outer surface from an outer surface of the hole to an outer surface of the substrate. For example, since the open region is formed by removing the outer surface of the hole from the outer surface of the substrate except for a portion between the electrode part and the hole, at the outermost side of the optical path control member in the open region, the portion of the hole, that is, the sealing part may become the outermost surface of the optical path control member.

Figure 16:
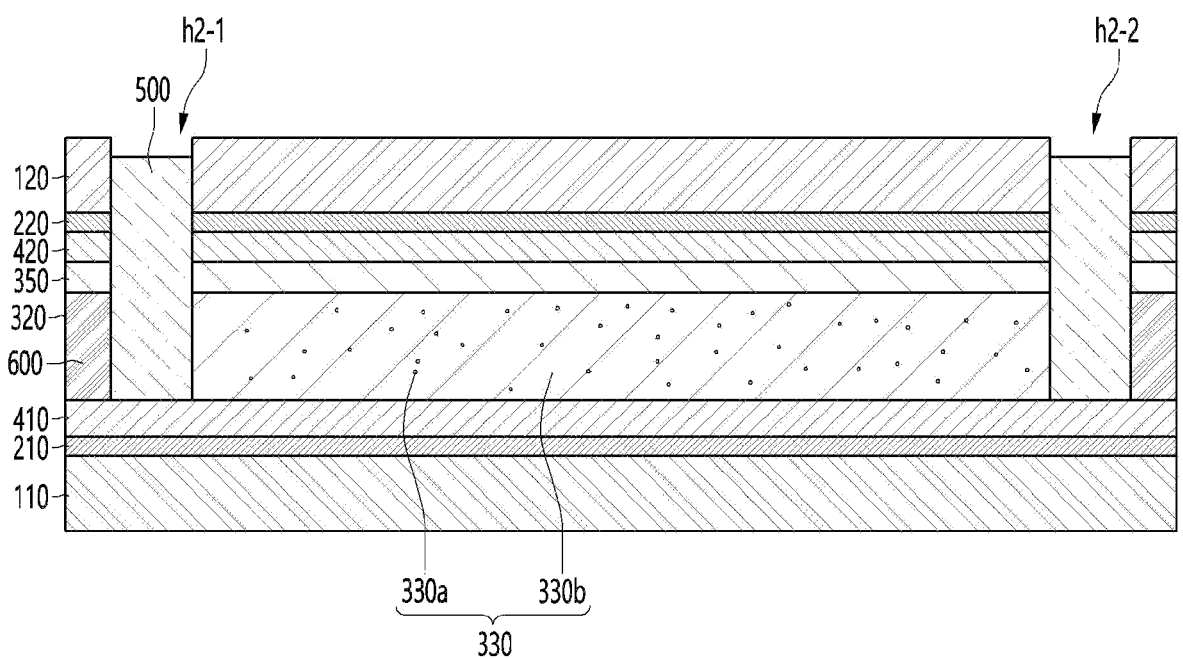
FIGS. 16 and 17 are cross-sectional views taken along line G-G' in FIG. 13.

FIG. 16 is a cross-sectional view taken along line G-G' in FIG. 13. That is, FIG. 16 is a cross-sectional view taken one end and the other end in the second direction of any one accommodating part among the plurality of accommodating parts of the photoconversion unit.

It is illustrated that the electrode connection part 700 is disposed inside the accommodating part in FIG. 16, but the embodiment is not limited thereto, and the electrode connection part 700 may be formed by removing the partition wall part from a partition wall part region, and hereinafter, it will be mainly described that the electrode connection part 700 is disposed inside the accommodating part.

Referring to FIG. 16, the light conversion material 330, the sealing part 500, and the dam part 600, and the electrode connection part 700 may be disposed in the accommodating part 320. That is, the light conversion material 330 may be disposed between the sealing parts 500, and the dam part 600 may be disposed between the sealing part 500 and the electrode connection part 700 or the outside of the second substrate 120. In this case, the electrode connection part 700 may be disposed outside the dam parts 600.

That is, the light conversion material 330, the sealing part 500, the dam part 600, and the electrode connection part 700 may be sequentially disposed while extending from a central region of the accommodating part 320 toward one end.

The light conversion material 330, the sealing part 500, the dam part 600, and the electrode connection part 700 may be disposed in contact with each other inside the accommodating part 320. That is, the light conversion material 330 may be disposed in direct contact with the sealing part 500, the sealing part 500 may be disposed in direct contact with the light conversion material 330 and the dam part 600, and the dam part 600 may be disposed in direct contact with the sealing part 500 and the electrode connection part 700.

In the optical path control member according to the third embodiment, by disposing the dam part and the light conversion material inside the accommodating part and disposing the sealing part between the dam part and the light conversion material, it is possible to reduce a bezel region and to improve the sealing characteristics.

In detail, the dam part 600 may be disposed inside the accommodating part to block the movement of the light conversion material so that the light conversion material may be disposed only between the dam parts. In addition, it is possible to inhibit the light conversion material 330 filled in the accommodating part 320 from overflowing the outside of the dam part 600 by heights of the base part 350, the buffer layer 420, the second electrode 220, and the second substrate 120 disposed above the dam part 600.

Therefore, since the dam part 600 is disposed only inside the accommodating part 320 and is not disposed in the partition wall part 310, the height of the dam part 600 may be reduced, and it is possible to inhibit an increase of the overall thickness of the optical path control member according to an increase in height of the dam part.

In addition, since the sealing part 500 is disposed inside the hole passing through the second substrate 120, the second electrode 220, the buffer layer 420, and the photoconversion unit 300, the sealing characteristics of the light conversion material may be improved by increasing an area where the sealing part 500 is disposed.

Figure 17:
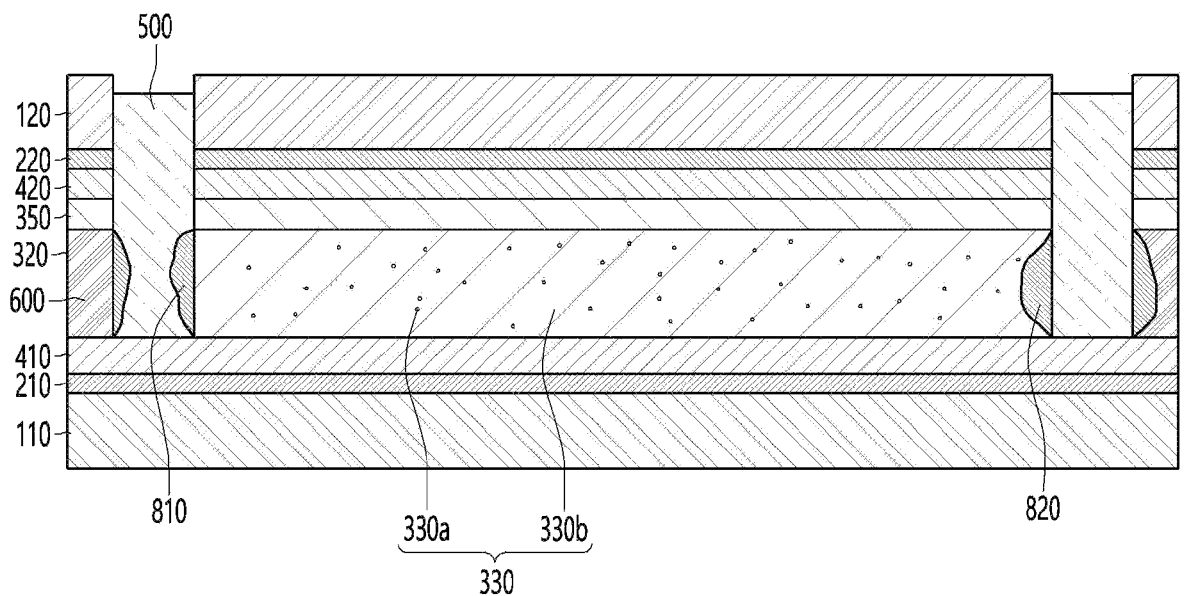

Meanwhile, referring to FIG. 17, a mixing region 800 may be formed inside the accommodating part 320. In detail, a first mixing region 810 formed by mixing the sealing material and the dam material may be formed between the sealing part 500 and the dam part 600, and a second mixed region 820 formed by mixing the sealing material and the light conversion material may be formed between the sealing part 500 and the light conversion material 330.

This may be formed by adjusting a material and curing time of the sealing material and the light conversion material of the sealing part, and even though the optical path control member changes a mode several times through the mixing region, it is possible to inhibit air from generating inside the sealing part by the sealing material from deeply penetrating into the accommodating part or penetrating the light conversion material of the accommodating part into the sealing part.

Figure 18:
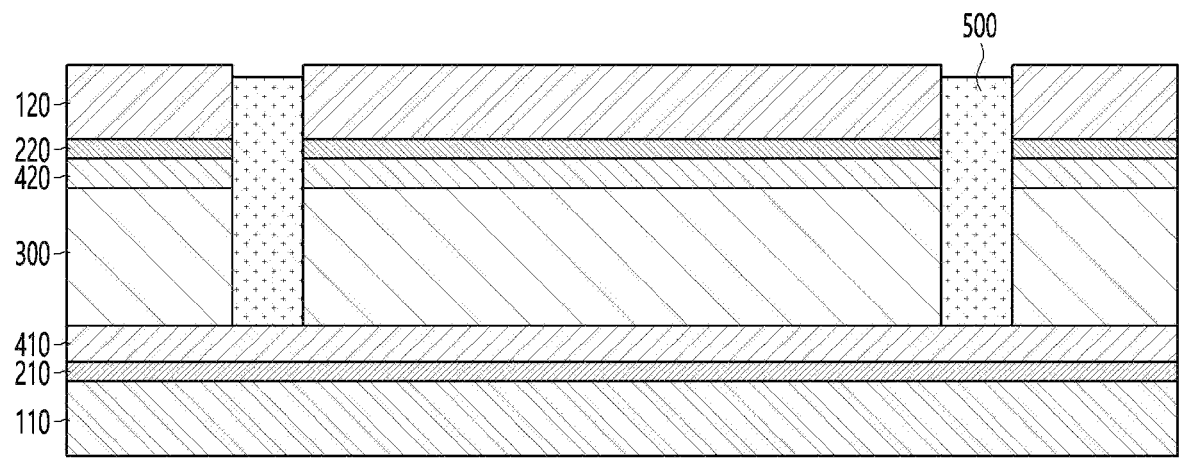
FIG. 18 is a cross-sectional view taken along line H-H' in FIG. 13.

FIG. 18 is a cross-sectional view taken along line H-H' in FIG. 13. That is, FIG. 18 is a cross-sectional view taken one end and the other end of one of the plurality of partition wall parts of the photoconversion unit.

Referring to FIG. 18, the partition wall part 310 may be removed in a region where the sealing part 500 is disposed. That is, the sealing part 500 may also be disposed in a region where the partition wall part is disposed. Accordingly, an area of the sealing part 500 may be increased by a size in which the partition wall part is removed.

Therefore, an arrangement area of the sealing part 500 may be increased without increasing the thickness of the sealing part 500.

Accordingly, the sealing characteristics of the light conversion material according to the sealing part 500 may be improved.

Hereinafter, referring to FIGS. 19 to 23, a display device to which an optical path control member according to an embodiment is applied will be described.

Figure 19:
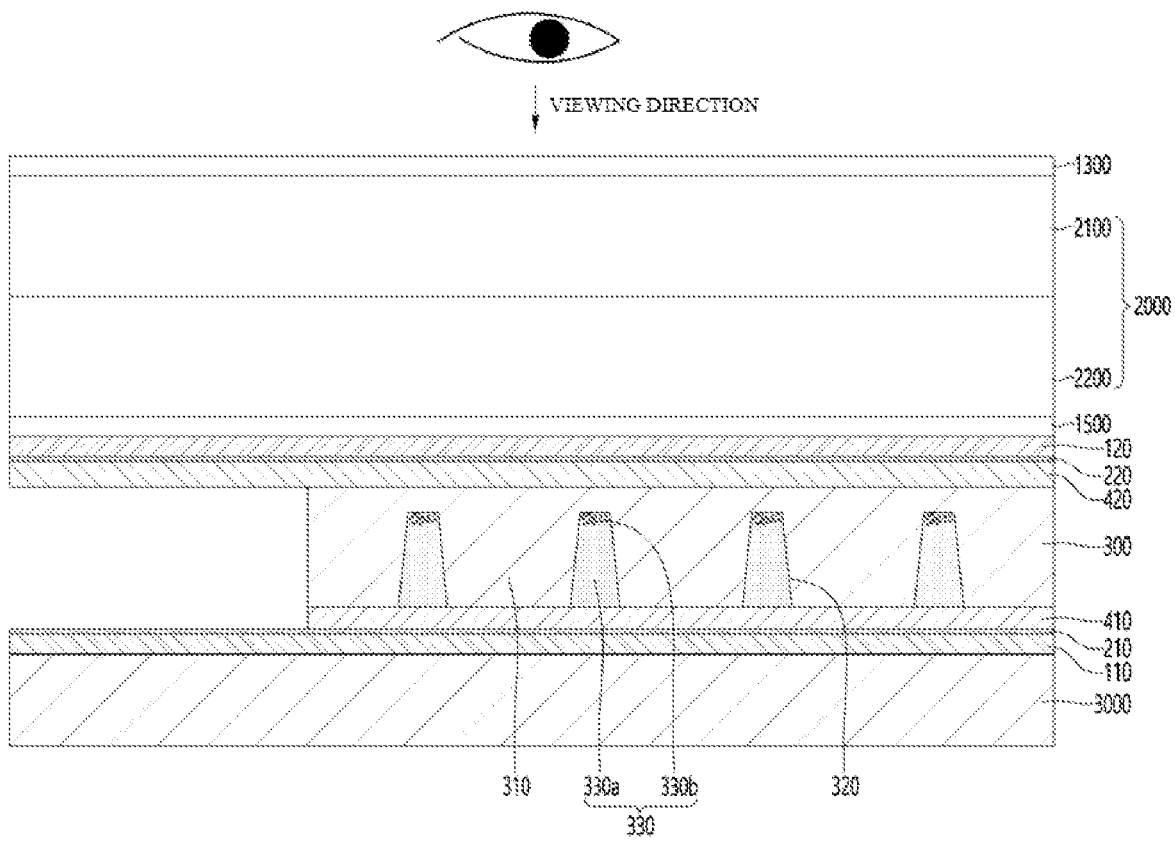
FIGS. 19 and 20 are cross-sectional views of a display device to which an optical path control member according to an embodiment is applied.
Figure 20:
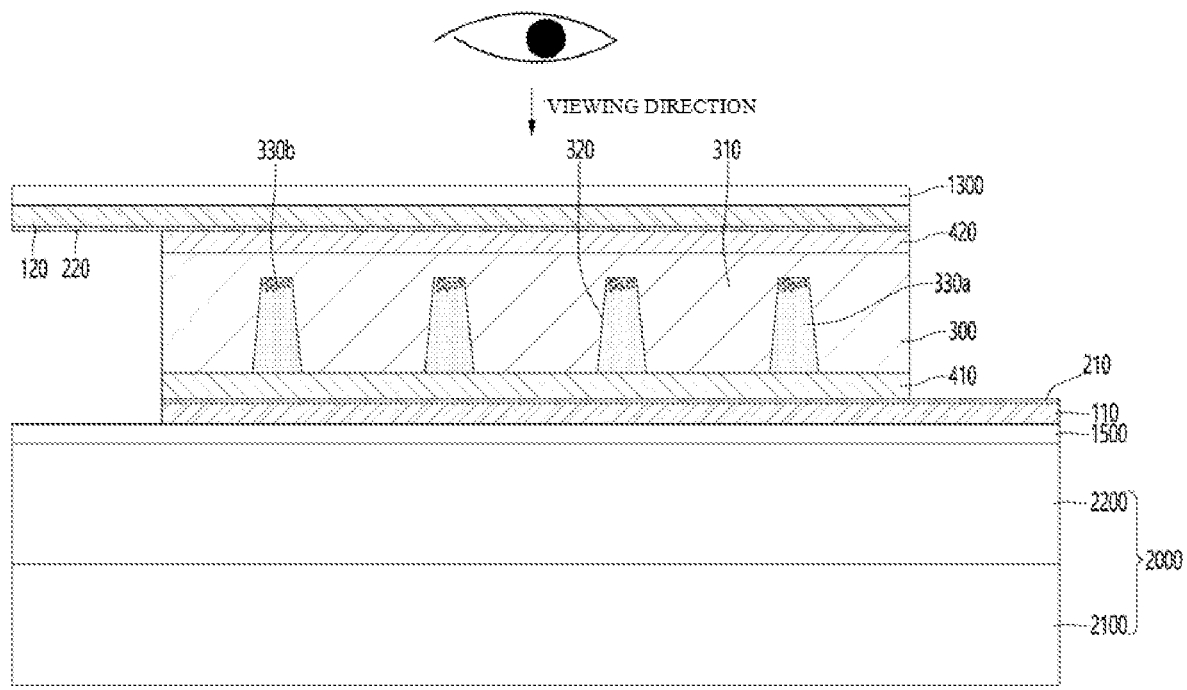

Referring to FIGS. 19 and 20, an optical path control member 1000 according to an embodiment may be disposed on or under a display panel 2000.

The display panel 2000 and the optical path control member 1000 may be disposed to be adhered to each other. For example, the display panel 2000 and the optical path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the optical path control member and the display panel, the optical path control member and the display panel may be adhered after the release film is removed.

The display panel 2000 may include a first' substrate 2100 and a second' substrate 2200. When the display panel 2000 is a liquid crystal display panel, the optical path control member may be formed under the liquid crystal panel. That is, when a surface viewed by the user in the liquid crystal panel is defined as an upper portion of the liquid crystal panel, the optical path control member may be disposed under the liquid crystal panel. The display panel 2000 may be formed in a structure in which the first' substrate 2100 including a thin film transistor (TFT) and a pixel electrode and the second' substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first' substrate 2100 and the second' substrate 2200 is bonded to the first' substrate 2100 with the liquid crystal layer interposed therebetween. That is, a thin film transistor may be formed on the first' substrate 2100, a protective film may be formed on the thin film transistor, and a color filter layer may be formed on the protective film. In addition, a pixel electrode in contact with the thin film transistor may be formed on the first' substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 19, the optical path control member may be disposed under the liquid crystal panel and on the backlight unit 3000, and the optical path control member may be disposed between the backlight unit 3000 and the display panel 2000.

Alternatively, as shown in FIG. 20, when the display panel 2000 is an organic electroluminescent display panel, the optical path control member may be formed on the organic electroluminescent display panel. That is, when the surface viewed by the user in the organic electroluminescent display panel is defined as an upper portion of the organic electroluminescent display panel, the optical path control member may be disposed on the organic electroluminescent display panel. The display panel 2000 may include a self-luminous element that does not require a separate light source. In the display panel 2000, a thin film transistor may be formed on the first' substrate 2100, and an organic light emitting element in contact with the thin film transistor may be formed. The organic light emitting element may include an anode, a cathode, and an organic light emitting layer formed between the anode and the cathode. In addition, the second' substrate 2200 configured to function as an encapsulation substrate for encapsulation may be further included on the organic light emitting element.

In addition, although not shown in drawings, a polarizing plate may be further disposed between the optical path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic electroluminescent display panel, the polarizing plate may be the external light reflection inhibiting polarizing plate.

In addition, an additional functional layer 1300 such as an anti-reflection layer, an anti-glare, or the like may be further disposed on the optical path control member 1000. Specifically, the functional layer 1300 may be adhered to one surface of the first substrate 110 of the optical path control member. Although not shown in drawings, the functional layer 1300 may be adhered to the first substrate 110 of the optical path control member via an adhesive layer. In addition, a release film for protecting the functional layer may be further disposed on the functional layer 1300.

Further, a touch panel may be further disposed between the display panel and the optical path control member.

It is shown in the drawings that the optical path control member is disposed at an upper portion of the display panel, but the embodiment is not limited thereto, and the optical path control member may be disposed at various positions such as a position in which light is adjustable, that is, a lower portion of the display panel, or between a second substrate and a first substrate of the display panel, or the like.

In addition, it is shown in the drawings that the photoconversion unit of the optical path control member according to the embodiment is in a direction parallel or perpendicular to an outer surface of the second substrate, but the photoconversion unit is formed to be inclined at a predetermined angle from the outer surface of the second substrate. Through this, a moire phenomenon occurring between the display panel and the optical path control member may be reduced.

Figure 21:
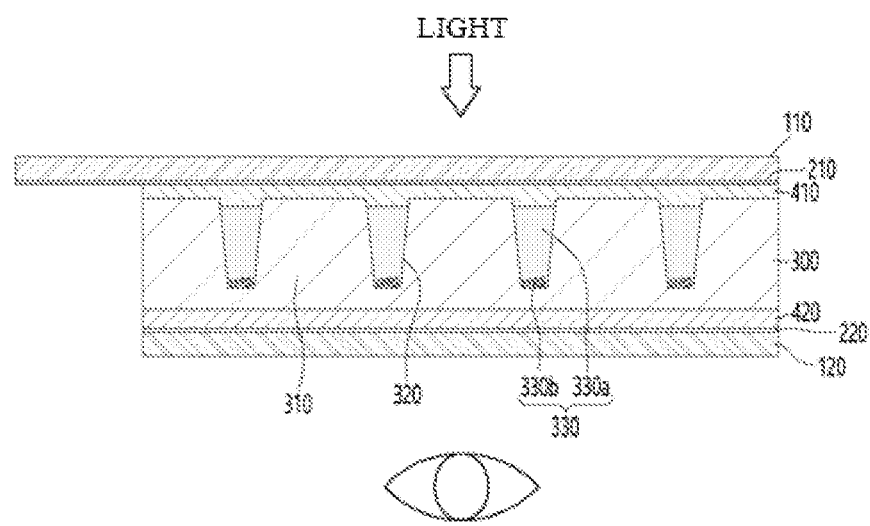
FIGS. 21 to 23 are views for describing one embodiment of the display device to which the optical path control member according to the embodiment is applied.
Figure 21:
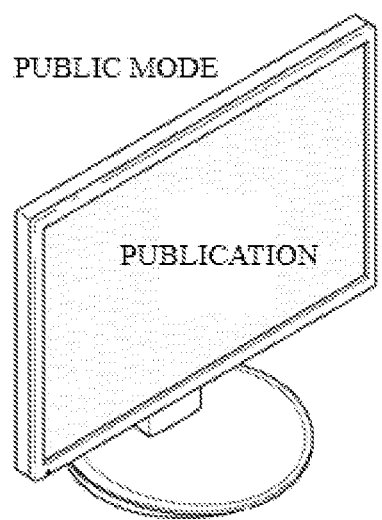
Figure 22:
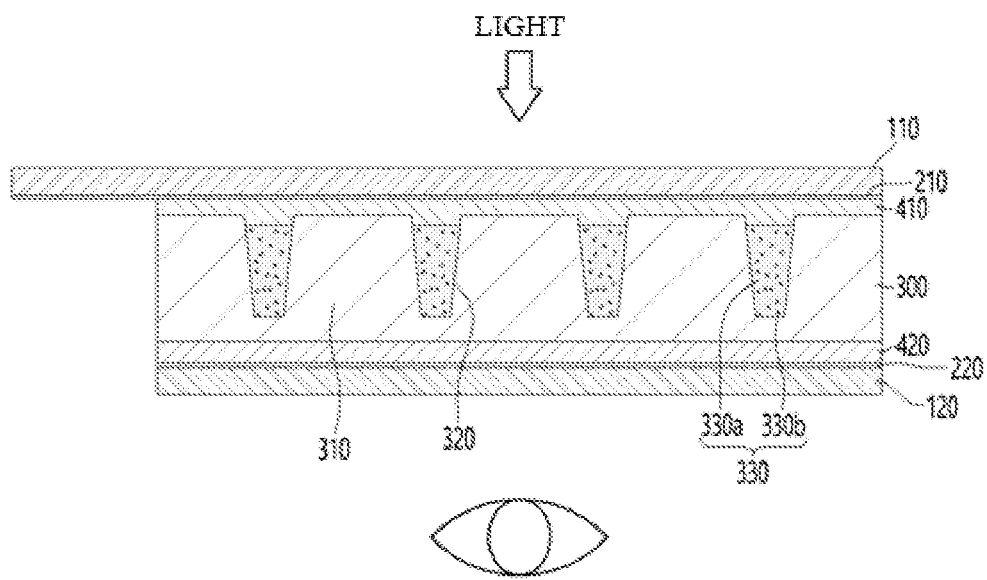
Figure 22:
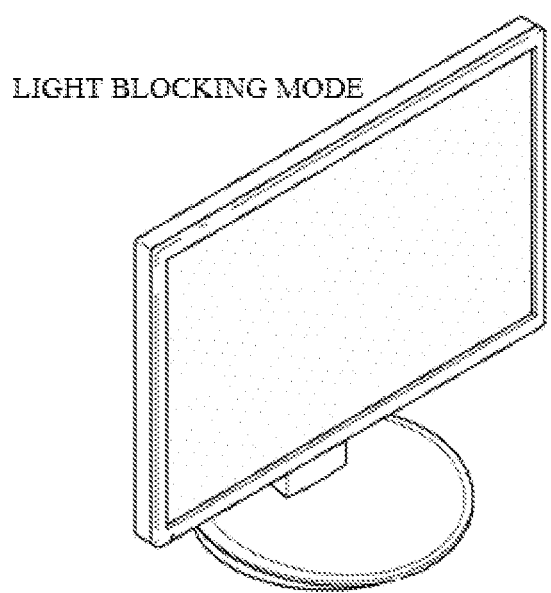
Figure 23:
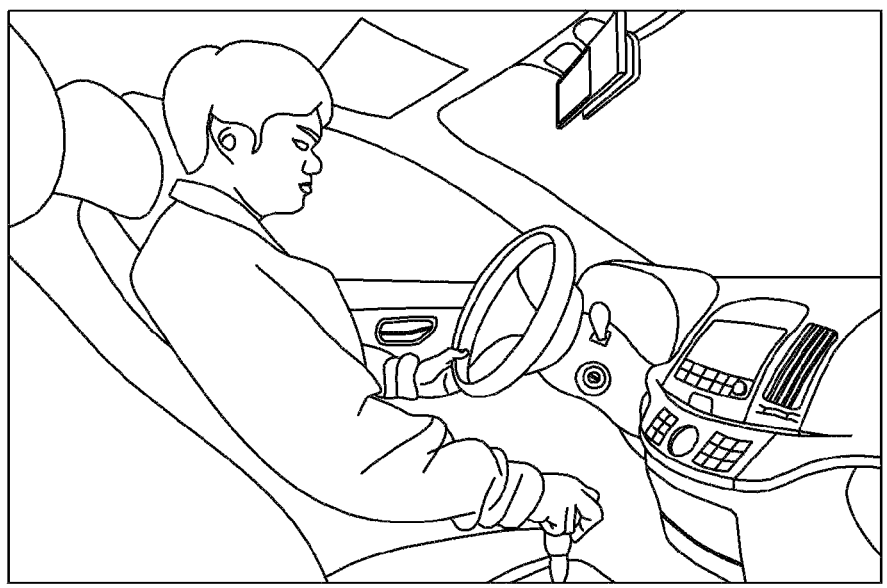

Referring to FIGS. 21 to 23, an optical path control member according to an embodiment may be applied to various display devices.

Referring to FIGS. 21 to 22, the optical path control member according to the embodiment may be applied to a display device that displays a display.

For example, when power is applied to the optical path control member as shown in FIG. 21, the accommodating part functions as the light transmitting part, so that the display device may be driven in the public mode, and when power is not applied to the optical path control member as shown in FIG. 22, the accommodating part functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 23, the display device to which the optical path control member according to the embodiment is applied may also be applied inside a vehicle.

For example, the display device including the optical path control member according to the embodiment may display a video confirming information of the vehicle and a movement route of the vehicle. The display device may be disposed between a driver seat and a passenger seat of the vehicle.

In addition, the optical path control member according to the embodiment may be applied to a dashboard that displays a speed, an engine, an alarm signal, and the like of the vehicle.

Further, the optical path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. An optical path control member comprising:
   a first substrate;
   a first electrode disposed on the first substrate;
   a second substrate disposed on the first substrate;
   a second electrode disposed under the second substrate;
   a photoconversion unit disposed between the first electrode and the second electrode; and
   an adhesive layer disposed between the first electrode and the photoconversion unit, wherein the second substrate includes at least one hole penetrating the second substrate and the second electrode, wherein an electrode connection part connected to a side surface of the second electrode is disposed inside the hole, wherein the second substrate includes an open region, wherein the hole is disposed on a protruding portion of the second substrate protruding by the open region, and wherein the adhesive layer is removed from one region on the first substrate corresponding to the open region to expose the first electrode.

2. The optical path control member of claim 1, comprising a buffer layer disposed between the second electrode and the photoconversion unit,
   wherein the photoconversion unit includes a partition wall part, an accommodating part, and a base part, and
   wherein the hole passes through the buffer layer and the base part.

3. The optical path control member of claim 2, wherein the electrode connection part is disposed in contact with a side surface of the second substrate, a side surface of the buffer layer, and a side surface of the base part.

4. The optical path control member of claim 1,
   wherein the electrode connection part is disposed in direct contact with the adhesive layer.

5. The optical path control member of claim 1, wherein the electrode connection part includes a material different from that of at least one of the first electrode and the second electrode.

6. The optical path control member of claim 5, wherein the electrode connection part includes a metal paste.

7. The optical path control member of claim 1, wherein a light transmittance of the electrode connection part is smaller than that of at least one of the first electrode and the second electrode.

8. The optical path control member of claim 1,
   wherein the electrode connection part is disposed to be spaced apart from the adhesive layer.

9. The optical path control member of claim 1,
   wherein an insulating layer is disposed between the electrode connection part and the adhesive layer.

10. The optical path control member of claim 1, wherein an upper surface of the electrode connection part is disposed on a same plane with an upper surface of the second substrate or lower than the upper surface of the second substrate.

11. The optical path control member of claim 1, wherein the second substrate includes a plurality of holes disposed on a plurality of protrusions, and the second substrate includes a first electrode connection part and a second electrode connection part that are disposed in the plurality of holes.

12. The optical path control member of claim 11, wherein the second substrate includes a first hole disposed on a first protrusion and a second hole disposed on a second protrusion,
   the first electrode connection part is disposed in the first hole,
   the second electrode connection part is disposed in the second hole, and
   depths of the first hole and the second hole are equal to or different from each other.

13. The optical path control member of claim 12, wherein the first hole and the second hole are spaced apart from each other by the open region.

14. The optical path control member of claim 12, wherein the first electrode exposed by removing the adhesive layer is disposed between the first electrode connection part and the second electrode connection part.

15. The optical path control member of claim 1, wherein the first substrate is disposed in a region corresponding to a portion or an entirety of the open region.

16. The optical path control member of claim 1, wherein an upper surface of the electrode connection part and an upper surface of the second substrate form a step.

17. The optical path control member of claim 1, wherein the photoconversion unit includes a dispersion liquid and photoconversion particles dispersed in the dispersion liquid and moved by application of a voltage.

18. A display device comprising:
   a panel including at least one of a display panel and a touch panel; and
   the optical path control member of claim 1, which is disposed on or under the panel.

19. The display device of claim 18, wherein the panel includes a backlight unit and a liquid crystal display panel,
   the optical path control member is disposed between the backlight unit and the liquid crystal display panel, and
   light emitted from the backlight unit moves in a direction of the second substrate from the first substrate.

20. The display device of claim 18, wherein the panel includes an organic electroluminescent display panel,
   the optical path control member is disposed on the organic electroluminescent display panel, and
   light emitted from the panel moves in a direction of the second substrate from the first substrate.

* * * * *